United States Patent
Kawamura et al.

(10) Patent No.: US 10,295,602 B2
(45) Date of Patent: May 21, 2019

(54) DEVICE FOR CALCULATING CHARGE/DISCHARGE CONDITION ADOPTABLE IN SECONDARY BATTERY OF HIGH-TEMPERATURE OPERATION TYPE

(71) Applicant: NGK INSULATORS, LTD., Nagoya (JP)

(72) Inventors: Yusuke Kawamura, Nagoya (JP); Hiroyuki Abe, Anjo (JP)

(73) Assignee: NGK Insulators, Ltd., Nagoya (JP)

( * ) Notice: Subject to any disclaimer, the term of this patent is extended or adjusted under 35 U.S.C. 154(b) by 102 days.

(21) Appl. No.: 15/649,845

(22) Filed: Jul. 14, 2017

(65) Prior Publication Data

US 2017/0315180 A1     Nov. 2, 2017

Related U.S. Application Data

(63) Continuation of application No. PCT/JP2016/053683, filed on Feb. 8, 2016.

(30) Foreign Application Priority Data

Feb. 23, 2015    (JP) .................................. 2015-032396

(51) Int. Cl.
    *G01R 31/36*       (2019.01)
    *H01M 10/39*      (2006.01)
    (Continued)

(52) U.S. Cl.
    CPC ..... *G01R 31/3655* (2013.01); *G01R 31/3606* (2013.01); *G01R 31/3634* (2013.01);
    (Continued)

(58) Field of Classification Search
    CPC ................................................ G01R 31/3655
    (Continued)

(56) References Cited

U.S. PATENT DOCUMENTS 5,955,869 A * 9/1999 Rathmann .......... G01R 31/3648
                                               320/132
7,489,108 B2     2/2009   Matsumoto et al.
(Continued)

FOREIGN PATENT DOCUMENTS

CN          103036262 A      4/2013
CN          104170205 A      11/2014
(Continued)

OTHER PUBLICATIONS

International Preliminary Report on Patentability (Application No. PCT/JP2016/053683) dated Sep. 8, 2017 (with English translation).

(Continued)

*Primary Examiner* — Yalkew Fantu
(74) *Attorney, Agent, or Firm* — Burr & Brown, PLLC

(57) ABSTRACT

A charge/discharge condition adoptable in a secondary battery of high-temperature operation type is calculated by a small amount of calculations. A resource matrix includes a plurality of state indicators and a plurality of charge/discharge conditions. The resource matrix is referred to and two or more state indicators related to an input state indicator so as to satisfy a condition are selected from the plurality of state indicators. A charge/discharge condition corresponding to each of the two or more selected state indicators are extracted from the plurality of charge/discharge conditions, so that two or more charge/discharge conditions are extracted. Interpolation is performed in the two or more selected state indicators and the two or more extracted charge/discharge conditions, so that a charge/discharge condition adoptable in a secondary battery in a case where a state of the secondary battery is indicated by the input state indicator, is calculated.

13 Claims, 12 Drawing Sheets

(51) Int. Cl.
    *H01M 10/44*     (2006.01)
    *H01M 10/633*     (2014.01)
    *H01M 10/48*     (2006.01)
    *H01M 10/42*     (2006.01)

(52) U.S. Cl.
    CPC ........ *G01R 31/3651* (2013.01); *H01M 10/39* (2013.01); *H01M 10/44* (2013.01); *H01M 10/48* (2013.01); *H01M 10/633* (2015.04); *H01M 2010/4278* (2013.01)

(58) Field of Classification Search
    USPC .......................................................... 320/132
    See application file for complete search history.

(56) References Cited

U.S. PATENT DOCUMENTS

| | | | | |
|---|---|---|---|---|
| 8,084,153 | B2* | 12/2011 | Tamakoshi | H01M 10/486 |
| | | | | 429/104 |
| 2002/0101218 | A1* | 8/2002 | Koenck | G01R 31/3655 |
| | | | | 320/140 |
| 2004/0128086 | A1 | 7/2004 | Barsoukov et al. | |
| 2006/0117194 | A1 | 6/2006 | Nishida | |
| 2008/0290833 | A1 | 11/2008 | Hayashi | |
| 2011/0264390 | A1* | 10/2011 | Shabra | G01R 31/3624 |
| | | | | 702/63 |
| 2013/0275065 | A1 | 10/2013 | Rathmann et al. | |
| 2014/0129165 | A1 | 5/2014 | Nagato et al. | |
| 2015/0002083 | A1 | 1/2015 | Nakao | |
| 2015/0084639 | A1* | 3/2015 | Joe | G01R 31/3651 |
| | | | | 324/428 |
| 2015/0142349 | A1 | 5/2015 | Fernandez et al. | |

FOREIGN PATENT DOCUMENTS

| | | |
|---|---|---|
| DE | 10 2010 035 363 A1 | 3/2012 |
| EP | 2 680 395 A2 | 1/2014 |
| JP | 2006-197727 A1 | 7/2006 |
| JP | 2006-275549 A1 | 10/2006 |
| JP | 2008-210586 A1 | 9/2008 |
| JP | 2010-093875 A1 | 4/2010 |
| WO | 2013/175006 A1 | 11/2013 |

OTHER PUBLICATIONS

International Search Report and Written Opinion (Application No. PCT/JP2016/053683) dated Apr. 5, 2016 (with English translation).
Supplementary European Search Report (Application No. 16735972.8) dated Jul. 7, 2017.
Chinese Office Action (with English translation), Chinese Application No. 201680006222.1, dated Feb. 18, 2019 (19 pages).

* cited by examiner

FIG. 2

| Temp(°C) | SOC (%) | D/C | Time(min) | | | | Temp_end (°C) | | | | SOC_end (%) | | | |
|---|---|---|---|---|---|---|---|---|---|---|---|---|---|---|
| | | | 100%P | 97.5%P | 0.5%P | | 100%P | 97.5%P | 0.5%P | | 100%P | 97.5%P | 0.5%P | |
| 305 | 100 | D | xxxx | xxxx | xxxx | | xxxx | xxxx | xxxx | | xxxx | xxxx | xxxx | |
| | 95 | D | xxxx | xxxx | xxxx | | xxxx | xxxx | xxxx | | xxxx | xxxx | xxxx | |
| | 0 | D | xxxx | xxxx | xxxx | | xxxx | xxxx | xxxx | | xxxx | xxxx | xxxx | |
| 306 | 100 | D | xxxx | xxxx | xxxx | | xxxx | xxxx | xxxx | | xxxx | xxxx | xxxx | |
| | 95 | D | xxxx | xxxx | xxxx | | xxxx | xxxx | xxxx | | xxxx | xxxx | xxxx | |
| | 0 | D | xxxx | xxxx | xxxx | | xxxx | xxxx | xxxx | | xxxx | xxxx | xxxx | |
| 339 | 100 | D | xxxx | xxxx | xxxx | | xxxx | xxxx | xxxx | | xxxx | xxxx | xxxx | |
| | 95 | D | xxxx | xxxx | xxxx | | xxxx | xxxx | xxxx | | xxxx | xxxx | xxxx | |
| | 0 | D | xxxx | xxxx | xxxx | | xxxx | xxxx | xxxx | | xxxx | xxxx | xxxx | |
| common | 100 | C | xxxx | xxxx | xxxx | | xxxx | xxxx | xxxx | | xxxx | xxxx | xxxx | |
| | 95 | C | xxxx | xxxx | xxxx | | xxxx | xxxx | xxxx | | xxxx | xxxx | xxxx | |
| | 0 | C | xxxx | xxxx | xxxx | | xxxx | xxxx | xxxx | | xxxx | xxxx | xxxx | |

FIG. 3

| Temp (°C) | Time (min) | D/C | P (%) | | | | Temp_end (°C) | | | | SOC_end (%) | | |
|---|---|---|---|---|---|---|---|---|---|---|---|---|---|
| | | | 100%SOC | 95%SOC | 0%SOC | 100%SOC | 95%SOC | 0%SOC | 100%SOC | 95%SOC | 0%SOC |
| 305 | 15 | D | xxxx | xxxx | xxxx | xxxx | xxxx | xxxx | xxxx | xxxx | xxxx |
| | 30 | D | xxxx | xxxx | xxxx | xxxx | xxxx | xxxx | xxxx | xxxx | xxxx |
| | 2880 | D | xxxx | xxxx | xxxx | xxxx | xxxx | xxxx | xxxx | xxxx | xxxx |
| 306 | 15 | D | xxxx | xxxx | xxxx | xxxx | xxxx | xxxx | xxxx | xxxx | xxxx |
| | 30 | D | xxxx | xxxx | xxxx | xxxx | xxxx | xxxx | xxxx | xxxx | xxxx |
| | 2880 | D | xxxx | xxxx | xxxx | xxxx | xxxx | xxxx | xxxx | xxxx | xxxx |
| 339 | 15 | D | xxxx | xxxx | xxxx | xxxx | xxxx | xxxx | xxxx | xxxx | xxxx |
| | 30 | C | xxxx | xxxx | xxxx | xxxx | xxxx | xxxx | xxxx | xxxx | xxxx |
| | 2880 | C | xxxx | xxxx | xxxx | xxxx | xxxx | xxxx | xxxx | xxxx | xxxx |
| common | 2880 | C | xxxx | xxxx | xxxx | xxxx | xxxx | xxxx | xxxx | xxxx | xxxx |

F I G. 5

POWER-PRIORITIZED RESOURCE MATRIX
↓ SELECTION AND EXTRACTION

| Temp (°C) | SOC (%) | D/C | Time (min) | | | | Temp_end (°C) | | | | SOC_end (%) | | | |
|---|---|---|---|---|---|---|---|---|---|---|---|---|---|---|
| | | | 100%P | 97.5%P | ⋯ | 0.5%P | 100%P | 97.5%P | ⋯ | 0.5%P | 100%P | 97.5%P | ⋯ | 0.5%P |
| Temp_j | SOC_j | D | xxxx | xxxx | ⋯ | xxxx | xxxx | xxxx | ⋯ | xxxx | xxxx | xxxx | ⋯ | xxxx |
| Temp_j | SOC_k | D | xxxx | xxxx | ⋯ | xxxx | xxxx | xxxx | ⋯ | xxxx | xxxx | xxxx | ⋯ | xxxx |
| Temp_k | SOC_j | D | xxxx | xxxx | ⋯ | xxxx | xxxx | xxxx | ⋯ | xxxx | xxxx | xxxx | ⋯ | xxxx |
| Temp_k | SOC_k | D | xxxx | xxxx | ⋯ | xxxx | xxxx | xxxx | ⋯ | xxxx | xxxx | xxxx | ⋯ | xxxx |

1150　1153　1151　1152

↓ INTERPOLATION

| Temp (°C) | SOC (%) | D/C | Time (min) | | | | Temp_end (°C) | | | | SOC_end (%) | | | |
|---|---|---|---|---|---|---|---|---|---|---|---|---|---|---|
| | | | 100%P | 97.5%P | ⋯ | 0.5%P | 100%P | 97.5%P | ⋯ | 0.5%P | 100%P | 97.5%P | ⋯ | 0.5%P |
| Temp_i | SOC_i | D | xxxx | xxxx | ⋯ | xxxx | xxxx | xxxx | ⋯ | xxxx | xxxx | xxxx | ⋯ | xxxx |

TIME-PRIORITIZED RESOURCE MATRIX
↓ SELECTION AND EXTRACTION

1180

| Temp (°C) | Time (min) | D/C | P (%) | | Temp_end (°C) | | SOC_end (%) | |
|---|---|---|---|---|---|---|---|---|
| | | | SOC_j | SOC_k | SOC_j | SOC_k | SOC_j | SOC_k |
| COMMON | 15 | C | xxxx | xxxx | xxxx | xxxx | xxxx | xxxx |
| | 30 | C | xxxx | xxxx | xxxx | xxxx | xxxx | xxxx |
| | 2880 | C | xxxx | xxxx | xxxx | xxxx | xxxx | xxxx |

1184 — 1181 ↓ INTERPOLATION 1182

| Temp (°C) | Time (min) | D/C | P (%) | Temp_end (°C) | SOC_end (%) |
|---|---|---|---|---|---|
| | | | SOC_i | SOC_i | SOC_i |
| Temp_i | 15 | C | xxxx | xxxx | xxxx |
| | 30 | C | xxxx | xxxx | xxxx |
| | 2880 | C | xxxx | xxxx | xxxx |

| Power (%) | Time (min) | d_SOC (%) | SOC_final (%) |
|---|---|---|---|
| 100 | xxxx | xxxx | xxxx |
| 95 | xxxx | xxxx | xxxx |
| 5 | xxxx | xxxx | xxxx |
| -5 | xxxx | -xxxx | xxxx |
| -10 | xxxx | -xxxx | xxxx |
| -100 | xxxx | -xxxx | xxxx |

1220 1221 1222 1223
1201

| Time(min) | Power (%) | d_SOC (%) | SOC_final (%) |
|---|---|---|---|
| 15 | xxxx | -xxxx | xxxx |
| 30 | xxxx | -xxxx | xxxx |
| 2880 | xxxx | -xxxx | xxxx |
| 15 | xxxx | xxxx | xxxx |
| 30 | xxxx | xxxx | xxxx |
| 2880 | xxxx | xxxx | xxxx |

DEVICE FOR CALCULATING CHARGE/DISCHARGE CONDITION ADOPTABLE IN SECONDARY BATTERY OF HIGH-TEMPERATURE OPERATION TYPE

TECHNICAL FIELD

The present invention relates to calculation of a charge/discharge condition which is adoptable in a secondary battery of high-temperature operation type.

BACKGROUND ART

A charge/discharge condition which is adoptable in a sodium-sulfur battery depends on a state of charge of a sodium-sulfur battery. For example, as a state of charge of a sodium-sulfur battery gets closer to the last stage of charge, power which can be discharged by a sodium-sulfur battery is increased, and a time during which a sodium-sulfur battery can continue discharging is made longer. Then, power which can be charged into a sodium-sulfur battery is reduced, and a time during which a sodium-sulfur battery can continue being charged is made shorter.

A charge/discharge condition which is adoptable in a sodium-sulfur battery depends also on a temperature of a sodium-sulfur battery. A reason why a charge/discharge condition adoptable in a sodium-sulfur battery depends on a temperature of a sodium-sulfur battery is that while heat generation or heat absorption occurs in a sodium-sulfur battery when a sodium-sulfur battery discharges and is charged, an upper limit of temperature which should not be violated, such as a maximum allowable temperature and a recommended operation temperature, is determined for a sodium-sulfur battery. A reason why heat generation or heat absorption occurs in a sodium-sulfur battery when a sodium-sulfur battery discharges and is charged is that a cell reaction which is an exothermic reaction proceeds in a sodium-sulfur battery when a sodium-sulfur battery discharges, a cell reaction which is an endothermic reaction proceeds in a sodium-sulfur battery when a sodium-sulfur battery is charged, and Joule heat is generated due to internal resistance in a sodium-sulfur battery when a sodium-sulfur battery discharges and is charged.

A charge/discharge condition which is adoptable in a sodium-sulfur battery depends also on a deterioration state of a sodium-sulfur battery. A reason why a charge/discharge condition which is adoptable in a sodium-sulfur battery depends also on a deterioration state of a sodium-sulfur battery is that internal resistance which causes Joule heat as described above varies with a deterioration state of a sodium-sulfur battery.

In some cases, a charge/discharge condition which is adoptable in a sodium-sulfur battery depends on the other factors than a state of charge, a temperature, and a deterioration state of a sodium-sulfur battery.

As described above, a charge/discharge condition which is adoptable in a sodium-sulfur battery depends on many factors such as a state of charge, a temperature, and a deterioration state. Thus, numerous calculations are needed in order to calculate a charge/discharge condition which is adoptable in a sodium-sulfur battery. Also a circumstance where charge power should be reduced as the last stage of charge approaches in the neighborhood of the last stage of charge when a sodium-sulfur battery is charged, or the like, is a cause of a need for numerous calculations. Charge power should be reduced as the last stage of charge approaches when a sodium-sulfur battery is charged, because internal resistance of a sodium-sulfur battery is sharply increased in the neighborhood of the last stage of charge so that it is necessary to reduce a voltage applied to a sodium-sulfur battery by reducing a current flowing in a sodium-sulfur battery in the neighborhood of the last stage of charge.

Meanwhile, it is desired to provide an operator of an electrical energy storage device including a sodium-sulfur battery with information rendering assistance in driving the electrical energy storage device. A technique described in Japanese Patent Application Laid-Open No. 2008-210586 is one example thereof.

PRIOR ART DOCUMENTS

Patent Documents

Patent Document 1: Japanese Patent Application Laid-Open No. 2008-210586

SUMMARY OF INVENTION

Problems to be Solved by the Invention

It is possible to calculate a charge/discharge condition which is adoptable in a sodium-sulfur battery by simulations, and provide an operator of the electrical energy storage device with a result of calculation with a view to providing the operator of the electrical energy storage device including a sodium-sulfur battery with information rendering assistance in operating the electrical energy storage device.

However, since numerus calculations are needed in order to calculate a charge/discharge condition which is adoptable in a sodium-sulfur battery as described above, it is difficult to calculate a charge/discharge condition which is adoptable in a sodium-sulfur battery in real time and provide an operator of an electrical energy storage device with a result of calculation in a situation where a state of charge, a temperature, a deterioration state, and the like vary moment by moment. Thus, it is expected to calculate a charge/discharge condition which is adoptable in a sodium-sulfur battery by a small amount of calculations. Such circumstances hold true for a secondary battery of high-temperature operation type other than a sodium-sulfur battery.

The present invention described below is made in order to solve the above problem. A problem which is to be solved by the present invention described below is to calculate a charge/discharge condition which is adoptable in a secondary battery of high-temperature operation type, by a small amount of calculations.

Means for Solving the Problems

A device for calculating a charge/discharge condition of a secondary battery of high-temperature operation type includes a memory mechanism and a calculation mechanism.

The memory mechanism stores a lookup table. The lookup table includes a plurality of state indicators and includes a charge/discharge condition corresponding to each of the plurality of state indicators, to thereby include a plurality of charge/discharge conditions. The plurality of charge/discharge conditions are determined so that the charge/discharge condition corresponding to each of the plurality of state indicators is adoptable in the secondary battery in a case where a state of the secondary battery is indicated by each of the plurality of state indicators. Each of the plurality of state indicators includes a value or a set of values. Each of the plurality of charge/discharge conditions includes a value or a set of values.

A state indicator which indicates the state of the secondary battery is input to the calculation mechanism. The input state indicator includes a value or a set of values. The calculation mechanism refers to the lookup table, selects two or more state indicators which are related to the input state indicator so as to satisfy a condition, from the plurality of state indicators, extracts a charge/discharge condition corresponding to each of selected two or more state indicators from the plurality of charge/discharge conditions, to thereby extract two or more charge/discharge conditions, performs interpolation in the two or more selected state indicators and the two or more extracted charge/discharge conditions, and calculates a charge/discharge condition which is adoptable in the secondary battery in a case where the state of the secondary battery is indicated by the input state indicator.

Effects of the Invention

A charge/discharge condition which is adoptable in a secondary battery of high-temperature operation type is calculated by a small amount of calculations.

These and other objects, features, aspects and advantages of the present invention will become more apparent from the following detailed description of the present invention when taken in conjunction with the accompanying drawings.

BRIEF DESCRIPTION OF DRAWINGS

FIG. 2 is a schematic view showing a power-prioritized resource matrix.

FIG. 3 is a schematic view showing a time-prioritized resource matrix.

FIG. 5 is a schematic view showing a temporary matrix generated in the course of processes.

FIG. 8 is a schematic view showing a temporary matrix generated in the course of processes.

FIG. 9 is a schematic view showing a power-prioritized output matrix.

DESCRIPTION OF EMBODIMENTS

1 Electrical Energy Storage System

Figure 1:
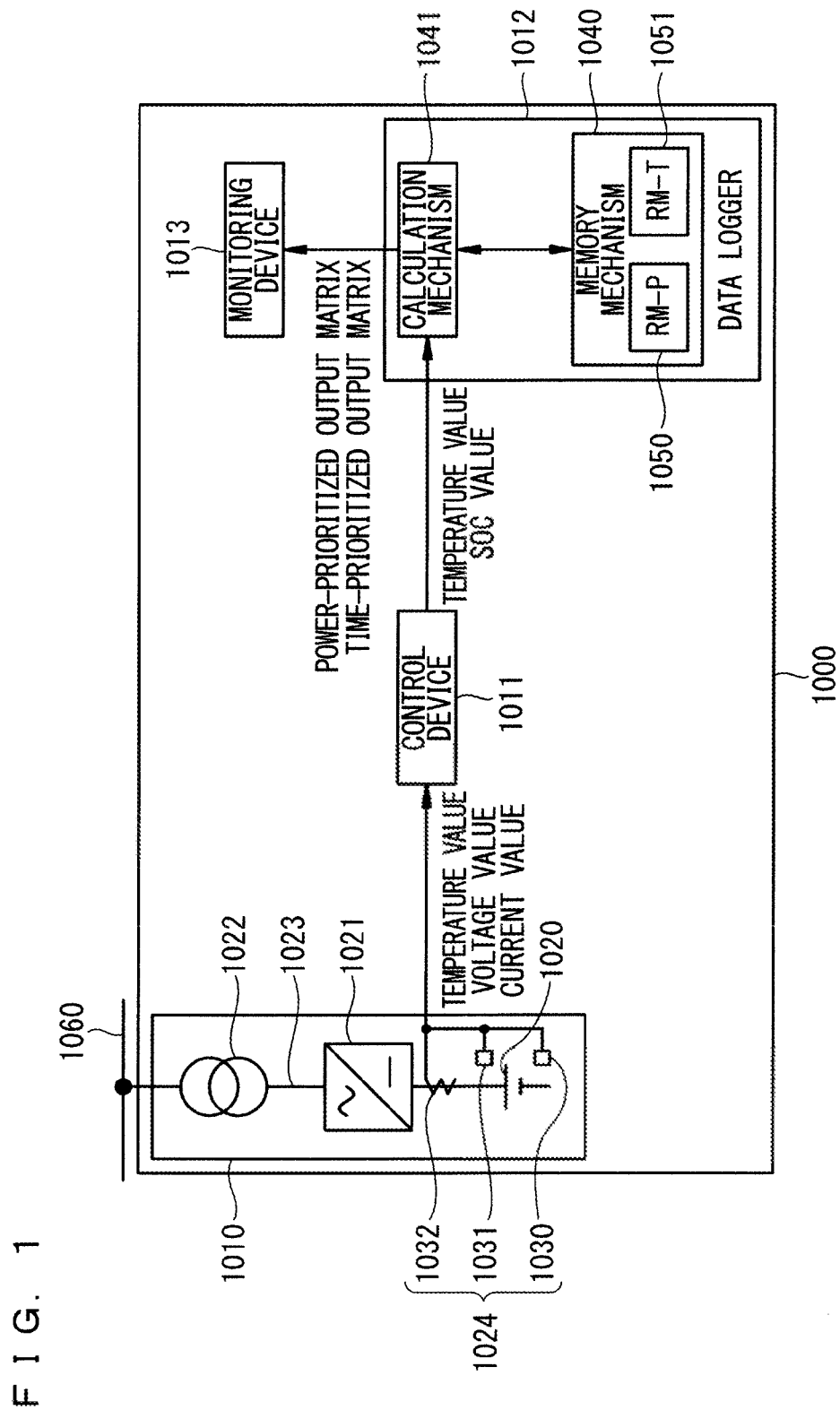
FIG. 1 is a block diagram showing an electrical energy storage system and an electrical power grid.

A block diagram of FIG. 1 shows an electrical energy storage system and an electrical power grid.

As shown in FIG. 1, an electrical energy storage system 1000 includes an electrical energy storage device 1010, a control device 1011, a data logger 1012, a monitoring device 1013, and the like. The electrical energy storage device 1010 includes a sodium-sulfur battery 1020, a bidirectional converter 1021, a transformer 1022, a power line 1023, a state detection mechanism 1024, and the like. The state detection mechanism 1024 includes a temperature sensor 1030, a voltage sensor 1031, a current sensor 1032, and the like. The data logger 1012 includes a memory mechanism 1040, a calculation mechanism 1041, and the like. The memory mechanism 1040 stores a power-prioritized resource matrix 1050 and a time-prioritized resource matrix 1051. Each of the power-prioritized resource matrix 1050 and the time-prioritized resource matrix 1051 is a candidate for a resource matrix which is referred to by the calculation mechanism 1041.

2 Electrical Energy Storage Device

The electrical energy storage device 1010 transmits power to an electrical power grid 1060, and receives power from the electrical power grid 1060. The sodium-sulfur battery 1020 is electrically connected to the electrical power grid 1060 through the power line 1023. The bidirectional converter 1021 and the transformer 1022 are interposed on the power line 1023. The transformer 1022 is interposed between the bidirectional converter 1021 and the system 1060. The sodium-sulfur battery 1020 may be replaced with a secondary battery of high-temperature operation type other than a sodium-sulfur battery. A structure of the electrical energy storage device 1010 may be altered. For example, a power device other than the bidirectional converter 1021 and the transformer 1022 may be interposed on the power line 1023.

When the electrical energy storage device 1010 transmits power to the system 1060, the sodium-sulfur battery 1020 discharges, and discharged power is transmitted from the sodium-sulfur battery 1020 to the electrical power grid 1060 through the power line 1023. The discharged power is converted from a direct current to an alternating current by the bidirectional converter 1021, and the voltage is increased by the transformer 1022.

When the electrical energy storage device 1010 receives power from the electrical power grid 1060, received power is transmitted from the electrical power grid 1060 to the sodium-sulfur battery 1020 through the power line 1023, and the sodium-sulfur battery 1020 is charged with the received power. The voltage of the received power is stepped down by the transformer 1022, and is converted from an alternating current to a direct current by the bidirectional converter 1021.

The state detection mechanism 1024 repeatedly detects a state of the sodium-sulfur battery 1020, and repeatedly inputs an indicator of a state of the sodium-sulfur battery 1020 to the control device 1011. In a case where the state detection mechanism 1024 includes the temperature sensor 1030, the voltage sensor 1031, and the a current sensor 1032, the temperature sensor 1030 senses a temperature of the sodium-sulfur battery 1020 and inputs a temperature value of the sodium-sulfur battery 1020 to the control device 1011, the voltage sensor 1031 senses a voltage of the sodium-sulfur battery 1020 and inputs a voltage value of the sodium-sulfur battery 1020 to the control device 1011, and the current sensor 1032 senses a current flowing in the sodium-sulfur battery 1020 and inputs a value of current flowing in the sodium-sulfur battery 1020, to the control device 1011, so that a state indicator which is input to the control device 1011 includes a set of a temperature value, a voltage value, and a current value.

A state indicator which is input to the control device 1011 may be changed to a value or a set of values other than a set of a temperature value, a voltage value, and a current value. For example, a state indicator which is input to the control device 1011 may be changed to a set of a temperature value, a voltage value, and a power value. In a case where a state indicator which is input to the control device 1011 is changed to a value or a set of values other than a set of a temperature value, a voltage value, and a current value, a structure of the state detection mechanism 1024 is altered. For example, in a case where a state indicator which is input to the control device 1011 is changed to a set of a temperature value, a voltage value, and a power value, the current sensor 1032 is replaced with a power sensor. A power sensor senses power which is discharged by the sodium-sulfur battery 1020 and power which is charged into the sodium-sulfur battery 1020, and inputs a value of power which is discharged by the sodium-sulfur battery 1020 and power which is charged into the sodium-sulfur battery 1020, to the control device 1011.

The electrical energy storage device 1010 may perform a load leveling operation or a load following operation. The electrical energy storage device 1010 may be used as a countermeasure for power outage or instantaneous voltage drop.

3 Control Device

The control device 1011 repeatedly calculates a secondary state indicator of the sodium-sulfur battery 1020 from an input primary state indicator of the sodium-sulfur battery 1020, and repeatedly inputs a calculated state indicator to the calculation mechanism 1041. A state indicator which is input to the calculation mechanism 1041 includes a set of a temperature value and a state-of-charge value (SOC value), and is used for calculating a charge/discharge condition which is adoptable in the sodium-sulfur battery 1020. A temperature value included in a state indicator which is input to the calculation mechanism 1041 agrees with a temperature value included in a state indicator which is input to the control device 1011. A temperature value included in a state indicator which is input to the calculation mechanism 1041 may be a value obtained by making a correction or the like to a temperature value included in a state indicator which is input to the control device 1011. An SOC value included in a state indicator which is input to the calculation mechanism 1041 is calculated from histories of a voltage value and a current value which are included in a state indicator which is input to the control device 1011.

A state indicator which is input to the calculation mechanism 1041 may be changed to a value or a set of values which indicates a state of a secondary battery, other than a set of a temperature value and an SOC value. For example, in a case where a state indicator which is input to the calculation mechanism 1041 is used for calculating a charge condition which is adoptable in the sodium-sulfur battery 1020, a state indicator which is input to the calculation mechanism 1041 may be changed to an SOC value. A reason for it is that since a cell reaction caused when the sodium-sulfur battery 1020 is charged is an endothermic reaction, there can occur a situation where it is unnecessary to consider that a temperature of the sodium-sulfur battery 1020 rises to be higher than an upper limit of temperature in calculating a charge condition of the sodium-sulfur battery 1020. Also, a state indicator which is input to the calculation mechanism 1041 may be changed to a set of temperature value, an SOC value, and the number of equivalent cycles. The number of equivalent cycles is the number of charge/discharge cycles required for reproducing a deterioration state of the sodium-sulfur battery 1020 when the sodium-sulfur battery 1020 is caused to discharge in capacity equal to rated capacity of the sodium-sulfur battery 1020 in each of a charge/discharge cycles, and the number of equivalent cycles is calculated from histories of a voltage value and a current value which are included in a state indicator input to the control device 1011. The number of equivalent cycles may be replaced with a deterioration state value of the sodium-sulfur battery 1020 other than the number of equivalent cycles. For example, the number of equivalent cycles may be replaced with an indicator value of internal resistance of the sodium-sulfur battery 1020. An indicator value of internal resistance is calculated from a voltage value and a current value included in a state indicator which is input to the control device 1011 when the sodium-sulfur battery 1020 discharges or is charged under a specific condition. For example, an indicator value of internal resistance is calculated from a voltage value and a current value included in a state indicator which is input to the control device 1011 when the sodium-sulfur battery 1020 discharges certain power for a certain time period since the last stage of discharge. An indicator value of internal resistance may be calculated from a voltage value and a current value included in a state indicator which is input to the control device 1011 when the sodium-sulfur battery 1020 accidentally discharges or is charged under a specific condition, or may be calculated from a voltage value and a current value included in a state indicator which is input to the control device 1011 when the sodium-sulfur battery 1020 is forced to discharge or be charged under a specific condition.

4 Data Logger

The data logger 1012 is a device for recording a state indicator which is input to the calculation mechanism 1041.

The data logger 1012 also serves as a device for calculating a power-prioritized output matrix and a time-prioritized output matrix. The data logger 1012 refers to the power-prioritized resource matrix 1050 or the time-prioritized resource matrix 1051, calculates in real time, a power-prioritized output matrix and a time-prioritized output matrix which correspond to a state indicator which is input to the calculation mechanism 1041, and inputs the calculated power-prioritized output matrix and the calculated time-prioritized output matrix to the monitoring device 1013.

Each of a power-prioritized output matrix and a time-prioritized output matrix includes a charge/discharge condition which is adoptable in the sodium-sulfur battery 1020. A charge/discharge condition includes a plurality of sets each including a charge/discharge power value and a charge/discharge time value, and indicates a charge/discharge allowable range of the sodium-sulfur battery 1020. A charge/discharge condition may include one set of a charge/discharge power value and a charge/discharge time value.

A device for calculating a power-prioritized output matrix and a time-prioritized output matrix may be provided independently of the data logger 1012.

The data logger 1012 may be a device with a low calculation capability, such as a programmable logic controller (PLC) and a personal computer (PC) for a logger. The memory mechanism 1040 is constituted by a memory and the like, and the calculation mechanism 1041 is constituted by a microprocessor and the like. A whole or a part of functions of the data logger 1012 may be fulfilled by a hardware which does not execute any program.

5 Monitoring Device

The monitoring device 1013 displays a power-prioritized output matrix and a time-prioritized output matrix which are input, on a display device. An operator refers to both or either of a power-prioritized output matrix and a time-prioritized output matrix which are displayed by the monitoring device 1013, and sets a charge/discharge condition of the sodium-sulfur battery 1020. A power-prioritized output matrix and a time-prioritized output matrix which are input may be provided to an operator in the other way than by being displayed on the display device. For example, a power-prioritized output matrix and a time-prioritized output matrix which are input may be printed out.

6 Power-Prioritized Resource Matrix 6.1 Basic Structure

A schematic view of FIG. 2 shows a power-prioritized resource matrix.

As shown in FIG. 2, the power-prioritized resource matrix 1050 is a lookup table, includes p×q state indicators 1100 when the number of temperature values is p and the number of SOC values is q, and includes a charge/discharge condition corresponding to each of the p×q state indicators 1100, to thereby include p×q charge/discharge conditions 1101, and further include a post-charge/discharge state indicator corresponding to each of the p×q state indicators 1100, to thereby include p×q post-charge/discharge state indicators 1102. As a result of this, in a case where a state indicator is selected from the p×q state indicators 1100, a charge/discharge condition corresponding to the selected state indicator can be extracted from the p×q charge/discharge conditions 1101, and a post-charge/discharge state indicator corresponding to the selected state indicator can be extracted from the p×q post-charge/discharge state indicators 1102.

The p×q charge/discharge conditions 1101 are previously determined by simulations, experiments, or the like so that a charge/discharge condition corresponding to each of the p×q state indicators 1100 can be adopted in the sodium-sulfur battery 1020 in a case where a state of the sodium-sulfur battery 1020 is indicated by each of the p×q state indicators 1100.

The p×q post-charge/discharge state indicators 1102 are previously determined by simulations, experiments, or the like so that a post-charge/discharge state of the sodium-sulfur battery 1020 can be indicated by a post-charge/discharge state indicator corresponding to each of the p×q state indicators 1100 in a case where a state of the sodium-sulfur battery 1020 is indicated by each of the p×q state indicators 1100 and the sodium-sulfur battery 1020 discharges or is charged under a charge/discharge condition corresponding to each of the p×q state indicators 1100.

The power-prioritized resource matrix 1050 includes a charge/discharge identifier corresponding to each of the p×q charge/discharge conditions 1101, to thereby include p×q charge/discharge identifiers 1103. As a result of this, a charge/discharge identifier corresponding to an extracted charge/discharge condition can be extracted from the p×q charge/discharge identifiers 1103.

A correspondence between a certain composing element included in the power-prioritized resource matrix 1050 and a different composing element included in the power-prioritized resource matrix 1050 is indicated by a fact that a value or a group of values included in the certain composing element belongs to the same row or the same column as a value or a group of values included in the different composing element. Specific examples thereof will be later provided.

The number of state indicators p×q which is a product of the number of temperature values p and the number of SOC values q is a natural number not smaller than two. A structure of the power-prioritized resource matrix 1050, the number of temperature values p, the number of SOC values q, and the number of state indicators p×q are changed in accordance with specifications of the data logger 1012.

6.2 State Indicator

Each of the p×q state indicators 1100 includes one set of a temperature value and an SOC value. The p×q state indicators 1100 are discrete. The p×q state indicators 1100 are arranged in a column direction.

The power-prioritized resource matrix 1050 includes p−1 temperature values of "305", "306", . . . , and "339", and one temperature value of "COMMON", to thereby include p temperature values. A temperature value of "COMMON" means an arbitrary temperature value. The power-prioritized resource matrix 1050 includes q SOC values of "100%", "95%", . . . , and "0%", for each of the p temperature values. As a result of this, p×q sets each of which includes a temperature value and an SOC value are formed, so that the p×q state indicators 1100 are formed.

The p temperature values are indexes for high-speed search. With a view to using the p temperature values as indexes for high-speed search, arrangement of the p−1 temperature values of "305", "306", . . . , and "339" in a column direction in an ascending order is followed by a single temperature value of "COMMON" being arranged in a column direction, and a distance between two adjacent temperature values in the p−1 temperature values of "305", "306", . . . , and "339" is set at a constant value of "1". As a result of this, a specific temperature value can be searched for by a small amount of calculations. The p−1 temperature values may be arranged in a descending order.

The q SOC values are indexes for high-speed search. With a view to using the q SOC values as indexes for high-speed search, the q SOC values are arranged in a column direction in a descending order, and a distance between two adjacent SOC values in the q SOC values is set at a constant value of "5". As a result of this, a specific SOC value can be searched for by a small amount of calculations. The q SOC values may be arranged in an ascending order.

The p×q state indicators 1100 are indexes for high-speed search. With a view to using the p×q state indicators 1100 as indexes for high-speed search, it is designed such that a specific temperature value and a specific SOC value can be searched for by a small amount of calculations.

A state indicator which is input to the calculation mechanism 1041 can be compared with each of the p×q state indicators 1100 included in the power-prioritized resource matrix 1050. Since a state indicator which is input to the calculation mechanism 1041 can be compared with each of the p×q state indicators 1100 included in the power-prioritized resource matrix 1050, a state indicator which agrees with, or is close to, a state indicator which is input to the calculation mechanism 1041 can be selected from the p×q state indicators 1100 included in the power-prioritized resource matrix 1050. In order to allow a state indicator which is input to the calculation mechanism 1041 to be compared with each of the p×q state indicators 1100 included in the power-prioritized resource matrix 1050, in a case where a state indicator which is input to the calculation mechanism 1041 is changed to a value or a set of values other than a set of a temperature value and an SOC value, also each of the p×q state indicators 1100 included in the power-prioritized resource matrix 1050 is changed to a value or a set of values other than a set of a temperature value and an SOC value. For example, in a case where a state indicator which is input to the calculation mechanism 1041 is changed to a set of a temperature value, an SOC value, and the number of equivalent cycles, also each of the p×q state indicators 1100 included in the power-prioritized resource matrix 1050 is changed to a set of a temperature value, an SOC value, and the number of equivalent cycles.

6.3 Charge/Discharge Condition

Each of the p×q charge/discharge conditions 1101 includes r sets each of which includes a charge/discharge power value and a charge/discharge time value. The p×q charge/discharge conditions 1101 are discrete.

Each of the p×q charge/discharge conditions 1101 includes r charge/discharge power values of "100%", "97.5%", . . . , and "0.5%" and includes a charge/discharge time value corresponding to each of the r charge/discharge power values, to thereby include r charge/discharge time values. As a result of this, r sets each of which includes a charge/discharge power value and a charge/discharge time value are formed.

The r charge/discharge time values are previously determined by simulations, experiments, or the like so that the longest time during which the sodium-sulfur battery 1020 can continue being charged or discharging is indicated by a charge/discharge time value corresponding to each of the r charge/discharge power values in a case where a charge/discharge power value of the sodium-sulfur battery 1020 is indicated by each of the r charge/discharge power values.

The r charge/discharge power values are indexes for high-speed search. With a view to using the r charge/discharge power values as indexes for high-speed search, the r charge/discharge power values are arranged in a row direction in a descending order, and a distance between two adjacent charge/discharge power values in the r charge/discharge power values except a lower end value of "0.5%", is set at a constant value of "2.5%". As a result of this, a specific charge/discharge power value can be searched for by a small amount of calculations. The r charge/discharge power values may be arranged in an ascending order.

Each of the r charge/discharge power values is represented by a ratio thereof to a maximum charge/discharge power value of the sodium-sulfur battery 1020. Each of the r charge/discharge power values may be represented in a different manner.

A correspondence between a charge/discharge condition and a state indicator is indicated by a fact that the r charge/discharge time values which are included in the charge/discharge condition are arranged in a row direction belong to the same row as an SOC value included in the state indicator. A correspondence between a charge/discharge time value and a charge/discharge power value is indicated by a fact that the charge/discharge time value belongs to the same column as the charge/discharge power value.

Each of the p×q charge/discharge conditions 1101 may be changed to a value or a set of values other than a set of a charge/discharge power value and a charge/discharge time value. For example, each of the p×q charge/discharge conditions 1101 may be changed to a set of a charge/discharge current value and a charge/discharge time value.

The number of charge/discharge power values r is a natural number not smaller than two. The number of charge/discharge time values r is changed in accordance with specifications of the data logger 1012.

6.4 Charge/Discharge Identifier

A charge/discharge identifier indicates which of a discharge condition and a charge condition is a charge/discharge condition corresponding to the charge/discharge identifier. A charge/discharge identifier of "D" indicates that a charge/discharge condition corresponding to the charge/discharge identifier of "D" is a discharge condition. A charge/discharge identifier of "C" indicates that a charge/discharge condition corresponding to the charge/discharge identifier of "C" is a charge condition.

A correspondence between a charge/discharge identifier and a charge/discharge condition is indicated by a fact that the charge/discharge identifier belongs to the same row as the r charge/discharge time values included in the charge/discharge condition.

A charge/discharge condition corresponding to a state indicator which includes a temperature value of any of "305", "306", . . . , and "339" corresponds to a charge/discharge identifier of "D". A charge/discharge condition corresponding to a state indicator which includes a temperature value of "COMMON" corresponds to a charge/discharge identifier of "C".

6.5 Post-Charge/Discharge State Indicator

Each of the p×q post-charge/discharge state indicators 1102 includes r sets each including a post-charge/discharge temperature value and a post-charge/discharge SOC value.

Each of the p×q post-charge/discharge state indicators 1102 includes a post-charge/discharge temperature value corresponding to each of the r charge/discharge power values of "100%", "97.5%", . . . , and "0.5%", to thereby include r post-charge/discharge temperature values, and includes a post-charge/discharge SOC value corresponding to each of the r charge/discharge power values of "100%", "97.5%", . . . , and "0.5%", to thereby include r post-charge/discharge SOC values. As a result of this, r sets each of which includes a post-charge/discharge temperature value and a post-charge/discharge SOC value are formed.

The r post-charge/discharge temperature values are previously determined by simulations, experiments, or the like so that a post-charge/discharge temperature of the sodium-sulfur battery 1020 is indicated by a post-charge/discharge temperature value corresponding to each of the r charge/discharge power values in a case where charge/discharge power of the sodium-sulfur battery 1020 is indicated by each of the r charge/discharge power values. The r post-charge/discharge SOC values are previously determined by simulations, experiments, or the like so that a post-charge/discharge SOC of the sodium-sulfur battery 1020 is indicated by a SOC values corresponding to each of the r charge/discharge power values in a case where charge/discharge power of the sodium-sulfur battery 1020 is indicated by each of the r charge/discharge power values.

A correspondence between a post-charge/discharge temperature value and a charge/discharge power value is indicated by a fact that the post-charge/discharge temperature value belongs to the same column as the charge/discharge power value. A correspondence between a post-charge/discharge SOC value and a charge/discharge power value is indicated by a fact that the post-charge/discharge SOC value belongs to the same column as the charge/discharge power value.

A set of a post-charge/discharge temperature value and a post-charge/discharge SOC value, which is included in each of the p×q post-charge/discharge state indicators 1102 included in the power-prioritized resource matrix 1050 may be changed to a value or a set of values other than a set of a post-charge/discharge temperature value and a post-charge/discharge SOC value.

7 Time-Prioritized Resource Matrix

A schematic view of FIG. 3 shows a time-prioritized resource matrix. The following description will deal with a time-prioritized resource matrix while focusing on differences from the power-prioritized resource matrix 1050.

As shown in FIG. 3, the time-prioritized resource matrix 1051 is a lookup table, includes p×q state indicators 1110, includes a charge/discharge conditions corresponding to each of the p×q state indicators 1110, to thereby include p×q charge/discharge conditions 1111, and includes a post-charge/discharge state indicator corresponding to each of the p×q state indicators 1110, to thereby include p×q post-charge/discharge state indicators 1112. In this respect, the time-prioritized resource matrix 1051 is similar to the power-prioritized resource matrix 1050.

In the power-prioritized resource matrix 1050, the q SOC values are arranged in a column direction. In contrast thereto, in the time-prioritized resource matrix 1051, the q SOC values are arranged in a row direction.

In the power-prioritized resource matrix 1050, each of the p×q charge/discharge conditions 1101 includes the r charge/discharge power values of "100%", "97.5%", . . . , and "0.5%", and includes a charge/discharge time value corresponding to each of the r charge/discharge power values, to thereby include the r charge/discharge time values. The r charge/discharge time values are determined so that the longest time during which the sodium-sulfur battery 1020 can continue being charged or discharging can be indicated by a charge/discharge time value corresponding to each of the r charge/discharge power values in a case where charge/discharge power of the sodium-sulfur battery 1020 is indicated by each of the r charge/discharge power values. In contrast thereto, in the time-prioritized resource matrix 1051, each of the p×q charge/discharge conditions 1111 includes s charge/discharge time values of "15", "30", . . . , and "2880", and includes a charge/discharge power value corresponding to each of the s charge/discharge time values, to thereby include s charge/discharge power values. The s charge/discharge power values are determined so that maximum power which can be charged into, or can be discharged by, the sodium-sulfur battery 1020 can be indicated by a charge/discharge power value corresponding to each of the s charge/discharge time values in a case where a charge/discharge time of the sodium-sulfur battery 1020 is indicated by each of the s charge/discharge time values.

In the power-prioritized resource matrix 1050, the r charge/discharge power values of "100%", "97.5%", . . . , and "0.5%" are used as indexes and are arranged in a row direction in a descending order, and a distance between two adjacent charge/discharge power values in the r charge/discharge power values except a lower end value of "0.5%" is set at a constant value of "2.5%". In contrast thereto, in the time-prioritized resource matrix 1051, the s charge/discharge time values of "15", "30", . . . , and "2880" are used as indexes and are arranged in a column direction in an ascending order, and a distance between two adjacent charge/discharge time values in the s charge/discharge time values is set at a constant value of "15".

The power-prioritized resource matrix 1050 includes a charge/discharge identifier corresponding to each of the p×q charge/discharge conditions 1101. In contrast thereto, the time-prioritized resource matrix 1051 includes a charge/discharge identifier corresponding to each of s sets each including a charge/discharge time value and a charge/discharge power value, which are included in each of the p×q charge/discharge conditions 1111, to thereby include p×s charge/discharge identifiers 1113.

8 Calculation Mechanism 8.1 Flow of Processes

Figure 4:
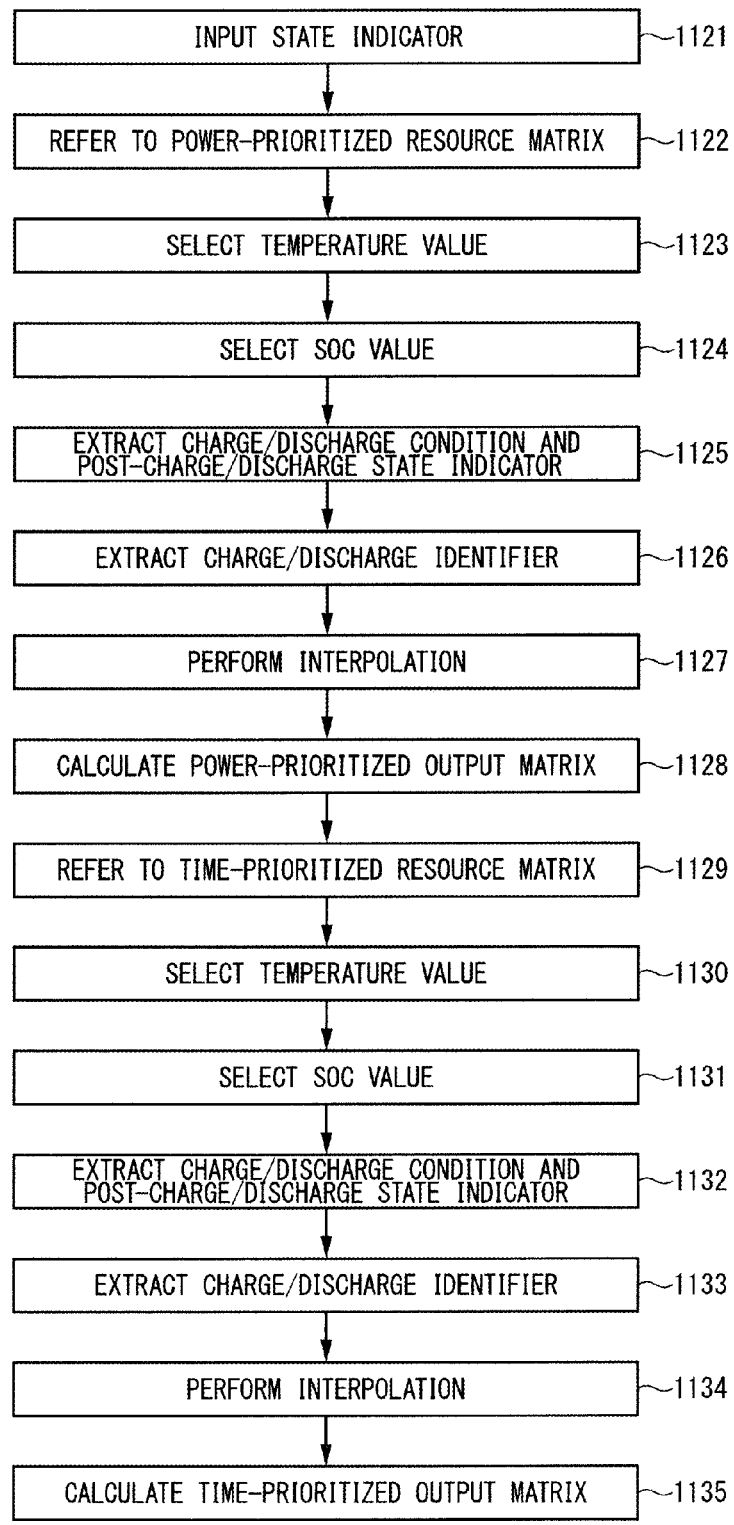
FIG. 4 is a flow chart showing a flow of processes performed by a calculation mechanism.
Figures 10, 11:
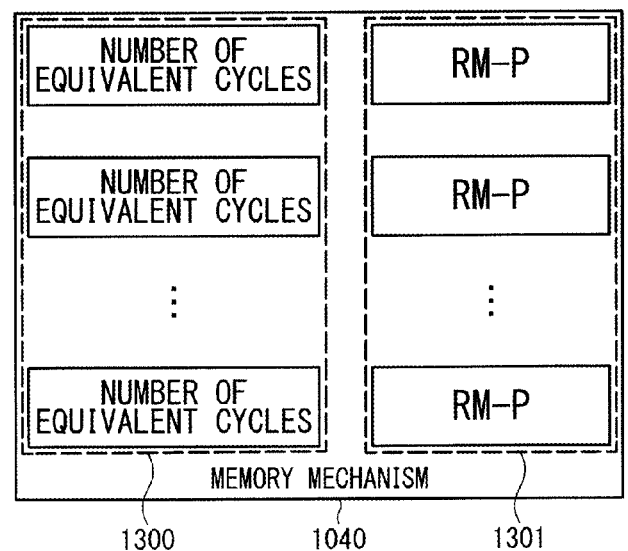
FIG. 10 is a schematic view showing a time-prioritized output matrix.
FIG. 11 is a schematic view showing data stored in a memory mechanism.

A flow chart of FIG. 4 shows a flow of processes performed by a calculation mechanism. Each of schematic views of FIGS. 5 to 8 shows a temporary matrix generated in the course of the processes. A schematic view of FIG. 9 shows a power-prioritized output matrix. A schematic view of FIG. 10 shows a time-prioritized output matrix.

The calculation mechanism 1041 receives an input of a state indicator which indicates a state of the sodium-sulfur battery 1020 in a step 1121 in FIG. 4, outputs a power-prioritized output matrix by referring to the power-prioritized resource matrix 1050 in steps 1122 to 1128 in FIG. 4, and outputs a time-prioritized output matrix by referring to the time-prioritized resource matrix 1051 in steps 1129 to 1135 in FIG. 4. An input state indicator includes a set of a temperature value Temp_i and an SOC value SOC_i.

The calculation mechanism 1041 may output only one of a power-prioritized output matrix and a time-prioritized output matrix which is selected. The memory mechanism 1040 may store only the power-prioritized resource matrix 1050, and the calculation mechanism 1041 may output only a power-prioritized output matrix. The memory mechanism 1040 may store only the time-prioritized resource matrix 1051, and the calculation mechanism 1041 may output only a time-prioritized output matrix.

8.2 Calculation of Power-Prioritized Output Matrix

The calculation mechanism 1041 refers to the power-prioritized resource matrix 1050 in the step 1122 in FIG. 4.

Subsequently, the calculation mechanism 1041, in the step 1123 in FIG. 4, selects two temperature values Temp_j and Temp_k other than a temperature value of "COMMON", and selects a temperature value of "COMMON", from the p temperature values included in the power-prioritized resource matrix 1050.

The two selected temperature values Temp_j and Temp_k are adjacent to each other in the p−1 temperature values of "305", "306", . . . , and "339" which are included in the power-prioritized resource matrix 1050. The selected temperature value Temp_j is lower than an input temperature value Temp_i. The selected temperature value Temp_k is higher than an input temperature value Temp_i. If any of the p−1 temperature values of "305", "306", . . . , and "339" which are included in the power-prioritized resource matrix 1050 agrees with an input temperature value Temp_i, the calculation mechanism 1041 selects one temperature value Temp_i other than a temperature value of "COMMON", and selects a temperature value of "COMMON", from the p temperature values included in the power-prioritized resource matrix 1050.

Subsequently, the calculation mechanism 1041, in the step 1124 in FIG. 4, selects two SOC values SOC_j and SOC_k from the q SOC values included in the power-prioritized resource matrix 1050, for each of the two selected temperature values Temp_j and Temp_k other than a temperature value of "COMMON", and the selected temperature value of "COMMON".

The two selected SOC values SOC_j and SOC_k are adjacent to each other in the q SOC values which are included in the power-prioritized resource matrix 1050. A selected SOC value SOC_j is lower than an input SOC value SOC_i. The selected SOC value SOC_k is higher than an input SOC value SOC_i. If any of the q SOC values included in the power-prioritized resource matrix 1050 agrees with an SOC value SOC_i, the calculation mechanism 1041 selects an SOC value SOC_i from the q SOC values included in the power-prioritized resource matrix 1050.

By the steps 1123 and 1124 shown in FIG. 4, as shown in FIG. 5, four sets each including a temperature value of any of "305", "306", . . . , and "339" and an SOC value are selected from the p×q sets each including a temperature value and an SOC value which are included in the power-prioritized resource matrix 1050. More specifically, four state indicators 1150 each of which includes a temperature value of any of "305", "306", . . . , and "339" are selected from the p×q state indicators included in the power-prioritized resource matrix 1050. The four state indicators 1150 are selected to be related to an input state indicator 1154 so as to satisfy a condition for allowing interpolation. In order to allow interpolation, two or more state indicators should be selected.

Figure 6:
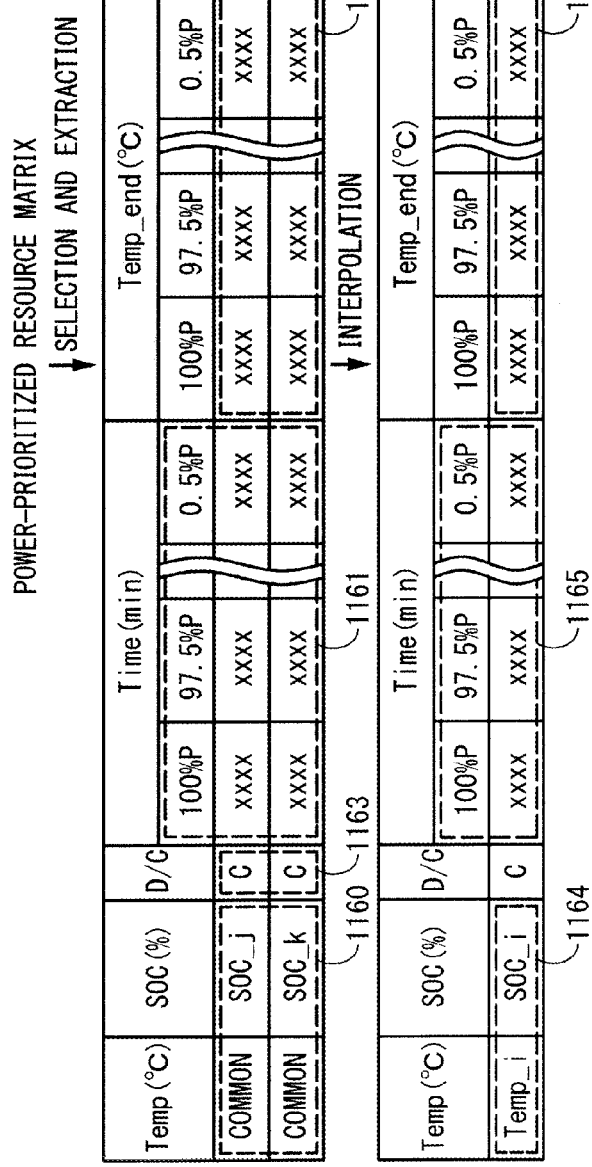
FIG. 6 is a schematic view showing a temporary matrix generated in the course of processes.

Further, by the steps 1123 and 1124 in FIG. 4, as shown in FIG. 6, two sets each including a temperature value of "COMMON" and an SOC value are selected from the p×q sets each including a temperature value and an SOC value which are included in the power-prioritized resource matrix 1050. More specifically, two state indicators 1160 each of which includes a temperature value of "COMMON" are selected from the p×q state indicators included in the power-prioritized resource matrix 1050. The two state indicators 1160 are selected to be related to an input state indicator 1164 so as to satisfy a condition for allowing interpolation. In order to allow interpolation, two or more state indicators should be selected.

Subsequently, the calculation mechanism 1041, in the step 1125 in FIG. 4, as shown in FIG. 5, extracts a charge/discharge condition corresponding to each of the four selected state indicators 1150, from the p×q charge/discharge conditions 1101 included in the power-prioritized resource matrix 1050, to thereby extract four charge/discharge conditions 1151, and extracts a post-charge/discharge state indicator corresponding to each of the four selected state indicators 1150 from the p×q post-charge/discharge state indicators 1102 included in the power-prioritized resource matrix 1050, to thereby extract four post-charge/discharge state indicators 1152.

Further, the calculation mechanism 1041, in the step 1125 in FIG. 4, as shown in FIG. 6, extracts a charge/discharge condition corresponding to each of the two selected state indicators 1160 from the p×q charge/discharge conditions 1101 included in the power-prioritized resource matrix 1050, to thereby extract two charge/discharge conditions 1161, and extracts a post-charge/discharge state indicator corresponding to each of the two selected state indicators 1160 from the p×q post-charge/discharge state indicators 1102 included in the power-prioritized resource matrix 1050, to thereby extract two post-charge/discharge state indicators 1162.

Subsequently, the calculation mechanism 1041, in the step 1126 in FIG. 4, as shown in FIG. 5, extracts a charge/discharge identifier of "D" corresponding to each of the four extracted charge/discharge conditions 1151 from the p×q charge/discharge identifiers 1103 included in the power-prioritized resource matrix 1050, to thereby extract four charge/discharge identifiers 1153. As a result of this, it is determined that each of the four extracted charge/discharge conditions 1151 is a discharge condition.

Further, the calculation mechanism 1041, in the step 1126 in FIG. 4, as shown in FIG. 6, a charge/discharge identifier of "C" corresponding to each of the two extracted charge/discharge conditions 1161 from the p×q charge/discharge identifiers 1103 included in the power-prioritized resource matrix 1050, to thereby extract two charge/discharge identifiers 1163. As a result of this, it is determined that each of the two extracted charge/discharge conditions 1161 is a charge condition.

Subsequently, the calculation mechanism 1041, in the step 1127 in FIG. 4, as shown in FIG. 5, performs linear interpolation in the four selected state indicators 1150 and the four extracted charge/discharge conditions (discharge conditions) 1151, calculates a power-prioritized charge/discharge condition (discharge condition) 1155 corresponding to the input state indicator 1154, performs linear interpolation in the four selected state indicators 1150 and the four extracted post-charge/discharge (post-discharge) state indicators 1152, and calculates a post-charge/discharge (post-discharge) state indicator 1156 corresponding to the input state indicator 1154. As a result of this, the power-prioritized charge/discharge condition (discharge condition) 1155 which is adoptable in the sodium-sulfur battery 1020 in a case where a state of the sodium-sulfur battery 1020 is indicated by the input state indicator 1154, is calculated, and the post-charge/discharge (post-discharge) state indicator 1156 which indicates a post-charge/discharge state of the sodium-sulfur battery 1020 in a state where a state of the sodium-sulfur battery 1020 is indicated by the input state indicator 1154 and the sodium-sulfur battery 1020 discharges or is charged under the power-prioritized charge/discharge condition (discharge condition) 1155, is calculated. Interpolation in the other way than linear interpolation may be performed.

In each of a case where one temperature value is selected from the p−1 temperature values of "305", "306", . . . , and "339" which are included in the power-prioritized resource matrix 1050 and two SOC values are selected from the q SOC values included in the power-prioritized resource matrix 1050, and a case where two temperature values are selected from the p−1 temperature values of "305", "306", . . . , and "339" included in the power-prioritized resource matrix 1050 and one SOC value is selected from the q SOC values included in the power-prioritized resource matrix 1050, two state indicators are selected in place of the four state indicators 1150, two charge/discharge conditions (discharge conditions) are extracted in place of the four charge/discharge conditions (discharge conditions) 1151, and two post-charge/discharge (post-discharge) state indicators are extracted in place of the four post-charge/discharge (post-discharge) state indicators 1152. In this case, linear interpolation is performed in the two selected state indicators and the two extracted charge/discharge conditions (discharge conditions), a power-prioritized charge/discharge condition (discharge condition) corresponding to the input state indicator 1154 is calculated, linear interpolation is performed in the two selected state indicators and the two extracted post-charge/discharge (post-discharge) state indicators, and a post-charge/discharge (post-discharge) state indicator corresponding to the input state indicator is calculated.

In a case where one temperature value is selected from the p−1 temperature values of "305", "306", . . . , and "339" included in the power-prioritized resource matrix 1050 and one SOC value is selected from the q SOC values included in the power-prioritized resource matrix 1050, one state indicator is selected in place of the four state indicators 1150, one charge/discharge condition (discharge conditions) is extracted in place of the four charge/discharge conditions 1151, and one post-charge/discharge (post-discharge) state indicator is extracted in place of the four post-charge/ discharge (post-discharge) state indicators 1152. In this case, linear interpolation is not performed exceptionally, and the extracted charge/discharge condition (discharge condition) and the extracted post-charge/discharge (post-discharge) state indicator are respectively used as a power-prioritized charge/discharge condition (discharge condition) and a post-charge/discharge (post-discharge) state indicator which correspond to the input state indicator 1154.

Further, the calculation mechanism 1041, in the step 1127 in FIG. 4, as shown in FIG. 6, performs interpolation in the two selected state indicators 1160 and the two extracted charge/discharge conditions (charge conditions) 1161, calculates a power-prioritized charge/discharge condition (charge condition) 1165 corresponding to the input state indicator 1164, performs interpolation in the two selected state indicators 1160 and the two extracted post-charge/discharge (post-charge) state indicators 1162, and calculates a post-charge/discharge (post-charge) state indicator 1166 corresponding to the input state indicator 1164. As a result of this, the power-prioritized charge/discharge condition (charge condition) 1165 which is adoptable in the sodium-sulfur battery 1020 in a case where a state of the sodium-sulfur battery 1020 is indicated by the input state indicator 1164 is calculated, and the post-charge/discharge (post-charge) state indicator 1166 which indicates a post-charge/discharge state of the sodium-sulfur battery 1020 in a case where a state of the sodium-sulfur battery 1020 is indicated by the input state indicator 1164 and the sodium-sulfur battery 1020 discharges or is charged under the power-prioritized charge/discharge condition (charge condition) 1165, is calculated. Interpolation in the other way than linear interpolation may be performed.

In a case where one SOC value is selected from the q SOC values, one state indicator is selected in place of the two state indicators 1160, one charge/discharge condition (charge condition) is extracted in place of the two charge/discharge conditions (charge conditions) 1161, and one post-charge/discharge (post-charge) state indicator is extracted in place of the two post-charge/discharge (post-charge) state indicators 1162. In this case, linear interpolation is not performed exceptionally, and the extracted charge/discharge condition (charge condition) and the extracted post-charge/discharge (post-charge) state indicator are respectively used as a power-prioritized charge/discharge condition (charge condition) and a post-charge/discharge (post-charge) state indicator which correspond to the input state indicator 1164.

Subsequently, the calculation mechanism 1041, in the step 1128 in FIG. 4, calculates a power-prioritized output matrix 1190 shown in FIG. 9, and inputs the power-prioritized output matrix 1190 to the monitoring device 1013.

As shown in FIG. 9, the power-prioritized output matrix 1190 is a table, and includes a discharge condition portion 1200 and a charge condition portion 1201. In the power-prioritized output matrix 1190, a rule which states that a discharge power value is represented by a positive number, and a charge power value is represented by a negative number, is used. Such a rule may be changed.

The discharge condition portion 1200 includes ten charge/discharge power values 1210 of "100%", "95%", . . . , and "5%", includes a charge/discharge time value corresponding to each of the ten charge/discharge power values 1210, to thereby include ten charge/discharge time values 1211, includes an increment of SOC value corresponding to each of the ten charge/discharge power values 1210, to thereby include ten increments of SOC values 1212, and includes a post-charge/discharge SOC value corresponding to each of the ten charge/discharge power values 1210, to thereby include ten post-charge/discharge SOC values 1213. The ten charge/discharge power values 1210 and the ten charge/discharge time values 1211 are respectively extracted from the r charge/discharge power values and the r charge/discharge time values which are included in the calculated charge/discharge condition 1155. The ten increments of SOC values 1212 are calculated from an SOC value included in the input state indicator 1154 and the r post-charge/discharge SOC values included in the calculated post-charge/discharge state indicator 1156. The ten post-charge/discharge SOC values 1213 are extracted from the r post-charge/discharge SOC values included in the calculated post-charge/discharge state indicator 1156.

The charge condition portion 1201 includes ten charge/discharge power values 1220 of "−5%", "−10%", . . . , and "−100%", includes a charge/discharge time value corresponding to each of the ten charge/discharge power values 1220, to thereby include ten charge/discharge time values 1221, includes an increment of SOC value corresponding to each of the ten charge/discharge power values 1220, to thereby include ten increments of SOC values 1222, and includes a post-charge/discharge SOC value corresponding to each of the ten charge/discharge power values 1220, to thereby include ten post-charge/discharge SOC values 1223. The ten charge/discharge power values 1220 and the ten charge/discharge time values 1221 are respectively extracted from the r charge/discharge power values and the r charge/discharge time values which are included in the extracted charge/discharge condition 1165. The ten increments of SOC values 1222 are calculated from an SOC value included in the input state indicator 1164 and the r post-charge/discharge SOC values included in the calculated post-charge/discharge state indicator 1166. The ten post-charge/discharge SOC values 1223 are extracted from the r post-charge/discharge SOC values included in the calculated post-charge/discharge state indicator 1166.

8.3 Calculation of Time-Prioritized Output Matrix

The following description will deal with calculation of a time-prioritized output matrix while focusing on differences from calculation of the power-prioritized output matrix 1190.

The calculation mechanism 1041 refers to the time-prioritized resource matrix 1051 in a step 1129 in FIG. 4.

Subsequently, the calculation mechanism 1041, in a step 1130 in FIG. 4, selects two temperature values Temp_j and Temp_k other than a temperature value of "COMMON", and selects a temperature value of "COMMON", from the p temperature values included in the time-prioritized resource matrix 1051.

Subsequently, the calculation mechanism 1041, in a step 1131 in FIG. 4, selects two SOC values SOC_j and SOC_k from the q SOC values included in the time-prioritized resource matrix 1051, for each of the two selected temperature values Temp_j and Temp_k other than a temperature value of "COMMON", and the selected temperature value of "COMMON".

Figure 7:
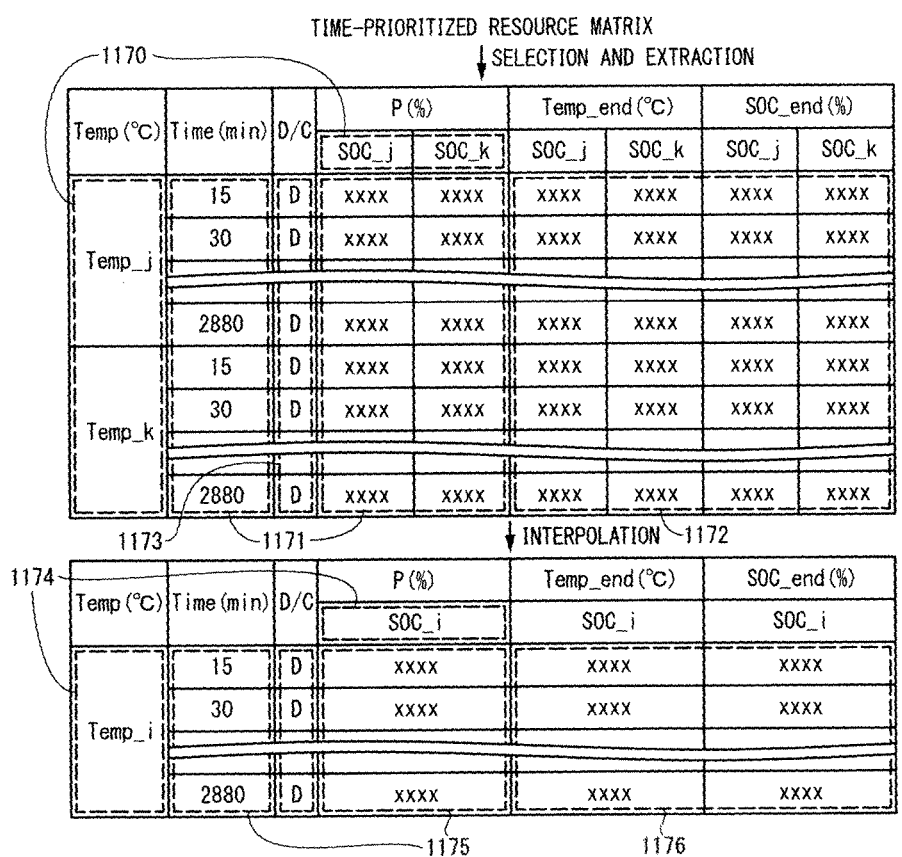
FIG. 7 is a schematic view showing a temporary matrix generated in the course of processes.

By the steps 1130 and 1131 in FIG. 4, as shown in FIG. 7, four state indicators 1170 each of which includes a temperature value of any of "305", "306", . . . , and "339", are selected from the p×q state indicators included in the time-prioritized resource matrix 1051.

Further, by the steps 1130 and 1131 in FIG. 4, as shown in FIG. 8, two state indicators 1180 each of which includes a temperature value of "COMMON", are selected from the p×q state indicators included in the time-prioritized resource matrix 1051.

Further, the calculation mechanism 1041, in the step 1132 in FIG. 4, as shown in FIG. 7, extracts a charge/discharge condition corresponding to each of the four selected state indicators 1170 from the p×q charge/discharge conditions 1111 included in the time-prioritized resource matrix 1051, to thereby extract four charge/discharge conditions 1171, and extracts a post-charge/discharge state indicator corresponding to each of the four selected state indicators 1170 from the p×q post-charge/discharge state indicators 1112 included in the time-prioritized resource matrix 1051, to thereby extract four post-charge/discharge state indicators 1172.

Further, the calculation mechanism 1041, in a step 1132 in FIG. 4, as shown in FIG. 8, extracts a charge/discharge condition corresponding to each of the two selected state indicators 1180 from the p×q charge/discharge conditions 1111 included in the time-prioritized resource matrix 1051, to thereby extract two charge/discharge conditions 1181, and extracts a post-charge/discharge state indicator corresponding to each of the two selected state indicators 1180 from the p×q post-charge/discharge state indicators 1112 included in the time-prioritized resource matrix 1051, to thereby extract two post-charge/discharge state indicators 1182.

Subsequently, the calculation mechanism 1041, in a step 1133 in FIG. 4, as shown in FIG. 7, extracts a charge/discharge identifier of "D" corresponding to each of the s sets each including a charge/discharge time value and a charge/discharge power value which are included in each of the four extracted charge/discharge conditions 1171, from the p×s charge/discharge identifiers 1113 included in the time-prioritized resource matrix 1051. As a result of this, it is determined that each of the four extracted charge/discharge conditions 1171 is a discharge condition.

Further, the calculation mechanism 1041, in the step 1133 in FIG. 4, as shown in FIG. 8, extracts a charge/discharge identifier of "C" corresponding to each of the s sets each including a charge/discharge time value and a charge/discharge power value which are included in each of the two extracted charge/discharge conditions 1181, from the p×s charge/discharge identifiers 1113 included in the time-prioritized resource matrix 1051. As a result of this, it is determined that each of the two extracted charge/discharge conditions 1181 is a charge condition.

Subsequently, the calculation mechanism 1041, in a step 1134 in FIG. 4, as shown in FIG. 7, performs linear interpolation in the four selected state indicators 1170 and the four extracted charge/discharge conditions (discharge conditions) 1171, calculates a time-prioritized charge/discharge condition (discharge condition) 1175 corresponding to an input state indicator 1174, performs linear interpolation in the four selected state indicators 1170 and the four extracted post-charge/discharge (post-discharge) state indicators 1172, and calculates a post-charge/discharge (post-discharge) state indicator 1176 corresponding to the input state indicator 1174.

Further, the calculation mechanism 1041, in the step 1134 in FIG. 4, as shown in FIG. 8, performs interpolation in the two selected state indicators 1180 and the two extracted charge/discharge conditions (charge conditions) 1181, calculates a time-prioritized charge/discharge condition (charge condition) 1185 corresponding to an input state indicator 1184, performs interpolation in the two selected state indicators 1180 and the two extracted post-charge/discharge (post-charge) state indicators 1182, and calculates a post-charge/discharge (post-charge) state indicator 1186 corresponding to the input state indicator 1184.

Subsequently, the calculation mechanism 1041, in a step 1135 in FIG. 4, calculates a time-prioritized output matrix 1230, and inputs the time-prioritized output matrix 1230 to the monitoring device 1013.

As shown in FIG. 10, the time-prioritized output matrix 1230 is a table, and includes a discharge condition portion 1240 and a charge condition portion 1241.

The discharge condition portion 1240 includes ten charge/discharge time values 1250 of "15", "30", . . . , and "2880", includes a charge/discharge power value corresponding to each of the ten charge/discharge time values 1250, to thereby include ten charge/discharge power values 1251, includes a increment of SOC value corresponding to each of the ten charge/discharge time values 1250, to thereby include ten increments of SOC values 1252, and includes a post-charge/discharge SOC value corresponding to each of the ten charge/discharge time values 1250, to thereby include ten post-charge/discharge SOC values 1253. The ten charge/discharge time values 1250 and the ten charge/discharge power values 1251 are respectively extracted from the s charge/discharge time values and the s charge/discharge power values which are included in the calculated charge/discharge condition 1175. The ten increments of SOC values 1252 can be calculated from an SOC value included in the input state indicator 1174 and the s post-charge/discharge SOC values included in the calculated post-charge/discharge state indicator 1176. The ten post-charge/discharge SOC values 1253 are extracted from the s post-charge/discharge SOC values included in the calculated post-charge/discharge state indicator 1176.

The charge condition portion 1241 includes ten charge/discharge time values 1260 of "15", "30", . . . , and "2880", includes a charge/discharge power value corresponding to each of the ten charge/discharge time values 1260, to thereby include ten charge/discharge power values 1261, includes a increment of SOC value corresponding to each of the ten charge/discharge time values 1260, to thereby include ten increments of SOC values 1262, and includes a post-charge/discharge SOC value corresponding to each of the ten charge/discharge time values 1260, to thereby include ten post-charge/discharge SOC values 1263. The ten charge/discharge time values 1260 and the ten charge/discharge power values 1261 are respectively extracted from the s charge/discharge time values and the s charge/discharge power values which are included in the calculated charge/discharge condition 1185. The ten increments of SOC values 1262 can be calculated from an SOC value included in the input state indicator 1184 and the s post-charge/discharge SOC values included in the calculated post-charge/discharge state indicator 1186. The ten post-charge/discharge SOC values 1263 are extracted from the s post-charge/discharge SOC values included in the calculated post-charge/discharge state indicator 1186.

In calculation of such the power-prioritized output matrix 1190 and the time-prioritized output matrix 1230 as described above, the charge/discharge conditions 1101 and 1111 which are previously determined are utilized, so that an amount of calculations can be reduced.

9 Output of Power-Prioritized Output Matrix Which Reflects the Number of Equivalent Cycles An embodiment in which a calculation mechanism calculates a power-prioritized output matrix which reflects the number of equivalent cycles will be described below.

A schematic view of FIG. 11 shows data stored in a memory mechanism in a case where a calculation mechanism calculates a power-prioritized output matrix which reflects the number of equivalent cycles. A flow chart of FIG.

12 shows a flow of processes performed by a calculation mechanism in a case where a calculation mechanism calculates a power-prioritized output matrix which reflects the number of equivalent cycles.

According to the present embodiment, as shown in FIG. 11, the memory mechanism 1040 stores a plurality of numbers of equivalent cycles 1300, and stores a power-prioritized resource matrix corresponding to each of the plurality of numbers of equivalent cycles 1300, to thereby store a plurality of power-prioritized resource matrices 1301.

The plurality of power-prioritized resource matrices 1301 are previously determined by simulations, experiments, or the like so that a power-prioritized charge/discharge condition can be calculated by using a power-prioritized resource matrix corresponding to each of the plurality of numbers of equivalent cycles 1300 as a resource matrix to be referred in a case where the number of equivalent cycles of the sodium-sulfur battery 1020 is indicated by each of the plurality of numbers of equivalent cycles 1300.

Each of the plurality of power-prioritized resource matrices 1301 is a candidate for a resource matrix to be referred.

Figure 12:
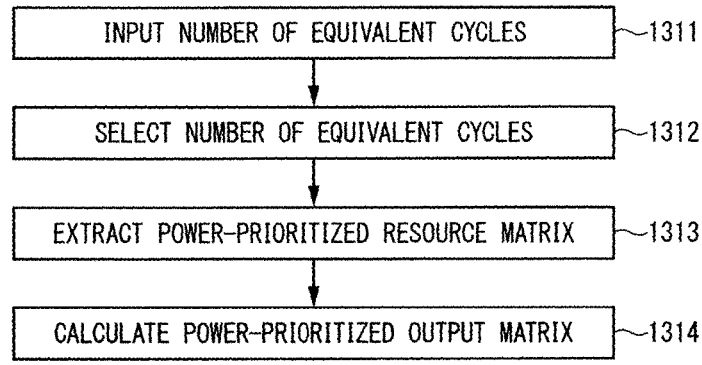
FIG. 12 is a flow chart showing a flow of processes performed by a calculation mechanism.

According to the present embodiment, the calculation mechanism 1041, in a step 1311 in FIG. 12, receives an input of the number of equivalent cycles.

Subsequently, the calculation mechanism 1041, in a step 1312 in FIG. 12, selects the number of equivalent cycles which is the closest to the input number of equivalent cycles, from the plurality of numbers of equivalent cycles 1300 stored in the memory mechanism 1040. The selected number of equivalent cycles may be changed. For example, the number of equivalent cycles which is the closest to the input number of equivalent cycles among the numbers of equivalent cycles which are larger than the input number of equivalent cycles may be selected, or the number of equivalent cycles which is the closest to the input number of equivalent cycles among the numbers of equivalent cycles which are smaller than the input number of equivalent cycles may be selected. More generally, the number of equivalent cycles which is related to the input number of equivalent cycles so as to satisfy a condition is selected.

Subsequently, the calculation mechanism 1041, in a step 1313 in FIG. 12, extracts a power-prioritized resource matrix corresponding to the selected number of equivalent cycles from the plurality of power-prioritized resource matrices 1301 stored in the memory mechanism 1040.

Subsequently, the calculation mechanism 1041, in a step 1314 in FIG. 12, calculates a power-prioritized output matrix in such a manner as shown in the steps 1121 to 1128 in FIG. 4 by using the extracted power-prioritized resource matrix as a resource matrix to be referred, to thereby calculate a power-prioritized output matrix corresponding to the input number of equivalent cycles. As a result of this, a power-prioritized output matrix which is adoptable in the sodium-sulfur battery 1020 in a case where a deterioration state of the sodium-sulfur battery 1020 is indicated by the input number of equivalent cycles is calculated.

In place of a power-prioritized output matrix, or in addition to a power-prioritized output matrix, similar calculations may be performed with respect to a time-prioritized output matrix.

The number of equivalent cycles may be replaced with a deterioration state value which indicates a deterioration state of the sodium-sulfur battery 1020, other than the number of equivalent cycles. For example, the number of equivalent cycles may be replaced with an indicator value of internal resistance.

Figure 13:
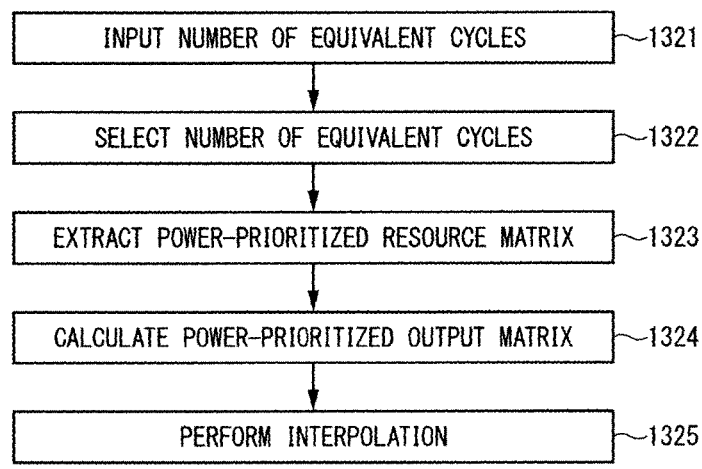
FIG. 13 is a flow chart showing a flow of processes performed by a calculation mechanism.

A flow chart of FIG. 13 shows a flow of processes performed by a calculation mechanism in a case where the calculation mechanism calculates a power-prioritized output matrix which reflects the number of equivalent cycles. Processes shown in FIG. 13 can be employed in place of the processes shown in FIG. 12.

According to the present embodiment, the calculation mechanism 1041, in a step 1321 in FIG. 13, receives an input of the number of equivalent cycles.

Subsequently, the calculation mechanism 1041, in a step 1322 in FIG. 13, selects two numbers of equivalent cycles between which the input number of equivalent cycles is interposed, from the plurality of numbers of equivalent cycles 1300 stored in the memory mechanism 1040. One of the two selected numbers of equivalent cycles is smaller than the input number of equivalent cycles. The other of the two selected numbers of equivalent cycles is larger than the input number of equivalent cycles. The two selected numbers of equivalent cycles are preferably adjacent to each other in the plurality of numbers of equivalent cycles 1300 stored in the memory mechanism 1040.

Subsequently, the calculation mechanism 1041, in a step 1323 in FIG. 13, extracts a power-prioritized resource matrix corresponding to each of the two selected numbers of equivalent cycles, from the plurality of power-prioritized resource matrices 1301 stored in the memory mechanism 1040, to thereby extract two power-prioritized resource matrices.

Subsequently, the calculation mechanism 1041, in a step 1324 in FIG. 13, calculates a power-prioritized output matrix in such a manner as shown in the steps 1121 to 1128 in FIG. 4 by using each of the two extracted power-prioritized resource matrices as a resource matrix to be referred, to thereby calculate two power-prioritized output matrices.

Subsequently, the calculation mechanism 1041 performs linear interpolation in the two selected numbers of equivalent cycles and the two calculated power-prioritized output matrices, to thereby calculate a power-prioritized output matrix corresponding to the input number of equivalent cycles. Interpolation in the other way than linear interpolation may be performed. As a result of this, a power-prioritized output matrix which is adoptable in the sodium-sulfur battery 1020 in a case where a deterioration state of the sodium-sulfur battery 1020 is indicated by the input number of equivalent cycles, is calculated.

By obtaining a power-prioritized output matrix corresponding to the input number of equivalent cycles in the above-described manner, the number of power-prioritized resource matrices stored in the memory mechanism 1040 is reduced, so that a storage capacity of the memory mechanism 1040 can be reduced.

10 Output of Power-Prioritized Resource Matrix for Each Upper Limit of Temperature Below, there will be described an embodiment in which a calculation mechanism calculates a power-prioritized output matrix for a case where a rise in a temperature of a sodium-sulfur battery to the maximum allowable temperature is permissible (which will be hereinafter referred to as a "a power-prioritized output matrix for a maximum allowable operation"), and a power-prioritized resource matrix for a case where a rise in a temperature of a sodium-sulfur battery to a recommended operation temperature is permissible (which will be hereinafter referred to as a "power-prioritized output matrix for a recommended operation").

Figure 14:
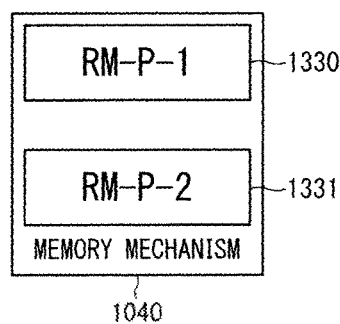
FIG. 14 is a schematic view showing data stored in a memory mechanism.
Figure 15:
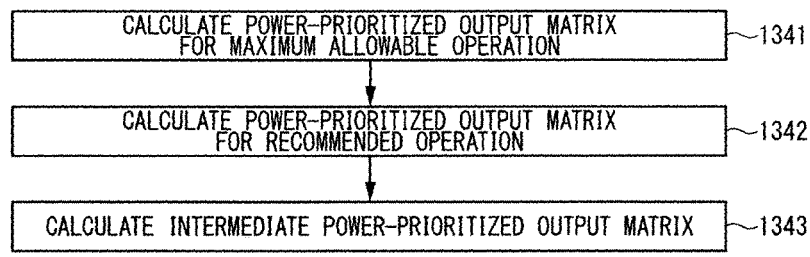
FIG. 15 is a flow chart showing a flow of processes performed by a calculation mechanism.

A schematic view of FIG. 14 shows data stored in a memory mechanism in a case where a calculation mechanism outputs a power-prioritized output matrix for a maximum allowable operation and a power-prioritized output matrix for a recommended operation. A schematic view of FIG. 15 shows a flow of process performed by a calculation mechanism in a case where a calculation mechanism outputs a power-prioritized output matrix for a maximum allowable operation and a power-prioritized output matrix for a recommended operation.

A maximum allowable temperature is determined so as to ensure prevention of breakdown of the sodium-sulfur battery 1020 while a temperature of the sodium-sulfur battery 1020 is not higher than a maximum allowable temperature. Thus, a temperature of the sodium-sulfur battery 1020 should not be higher than a maximum allowable temperature even for a short period of time. A recommended operation temperature is determined so as to ensure retention of predetermined performance over a predetermined life in the sodium-sulfur battery 1020 while a temperature of the sodium-sulfur battery 1020 is not higher than a recommended operation temperature. Thus, though a temperature of the sodium-sulfur battery 1020 is allowed to become higher than a recommended operation temperature only for a short period of time, a temperature of the sodium-sulfur battery 1020 is preferably set to be not higher than a recommended operation temperature.

According to the present embodiment, as shown in FIG. 14, the memory mechanism 1040 stores a power-prioritized resource matrix 1330 for a case where a rise in a temperature of the sodium-sulfur battery 1020 to a maximum allowable temperature is permissible (which will be hereinafter referred to as a "power-prioritized resource matrix 1330 for a maximum allowable operation"), and a power-prioritized resource matrix 1331 in a case where a rise in a temperature of the sodium-sulfur battery 1020 to a recommended operation temperature is permissible (which will be hereinafter referred to as a "power-prioritized resource matrix 1331 for a recommended operation").

Each of the power-prioritized resource matrix 1330 for a maximum allowable operation and the power-prioritized resource matrix 1331 for a recommended operation is a candidate for a resource matrix to be referred.

According to the present embodiment, the calculation mechanism 1041, in a step 1341 in FIG. 15, calculates a power-prioritized output matrix in such a manner as shown in the steps 1121 to 1128 in FIG. 4 by using the power-prioritized resource matrix 1330 for a maximum allowable operation as a resource matrix to be referred, to thereby calculate a power-prioritized output matrix for a maximum allowable operation.

Subsequently, the calculation mechanism 1041, in a step 1342 in FIG. 15, calculates a power-prioritized output matrix in such a manner as shown in the steps 1121 to 1128 in FIG. 4 by using the power-prioritized resource matrix 1331 for a recommended operation as a resource matrix to be referred, to thereby calculate a power-prioritized output matrix for a recommended operation.

Subsequently, the calculation mechanism 1041, in a step 1343 in FIG. 15, calculates a power-prioritized output matrix for a case where a rise in a temperature of the sodium-sulfur battery 1020 to a temperature which is intermediate between a maximum allowable temperature and a recommended operation temperature is permissible. A power-prioritized output matrix for a case where a rise in a temperature of the sodium-sulfur battery 1020 to a temperature which is intermediate between a maximum allowable temperature and a recommended operation temperature is permissible, is calculated, for example, by carrying out arithmetic averaging or weighted averaging on a power-prioritized output matrix for a maximum allowable operation and a power-prioritized output matrix for a recommended operation. In the step 1343, two or more power-prioritized output matrices which are different from each other in weighting coefficient, may be calculated. The step 1343 may be omitted.

Each or either of a maximum allowable temperature and a recommended operation temperature may be changed to an upper limit of temperature other than a maximum allowable temperature and a recommended operation temperature. More generally, the calculation mechanism 1041 calculates a power-prioritized output matrix for a case where a rise in a temperature of the sodium-sulfur battery 1020 to a relatively high upper limit of temperature TH is permissible, and a power-prioritized output matrix for a case where a rise in a temperature of the sodium-sulfur battery 1020 to a relatively low upper limit of temperature TL (TL<TH) is permissible.

In place of a power-prioritized output matrix, or in addition to a power-prioritized output matrix, similar calculations may be performed with respect to a time-prioritized output matrix.

11 Output of Power-Prioritized Output Matrix for Each Heat Dissipation Amount

Below, there will be described an embodiment in which a calculation mechanism calculates a power-prioritized output matrix for a case where an amount of heat dissipated from a sodium-sulfur battery is a maximum heat dissipation amount and a power-prioritized output matrix for a case where an amount of heat dissipated from a sodium-sulfur battery is a minimum heat dissipation amount, in a case where an amount of heat dissipated from a sodium-sulfur battery is variable.

Figure 16:
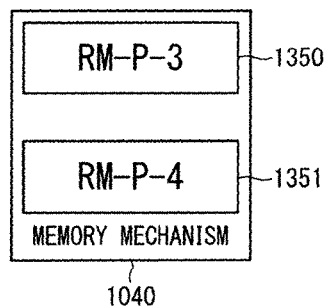
FIG. 16 is a schematic view showing data stored in a memory mechanism.

A schematic view of FIG. 16 shows data stored in a memory mechanism in a case where a calculation mechanism calculates a power-prioritized output matrix for a case where an amount of heat dissipated from a sodium-sulfur battery is a maximum heat dissipation amount, and a power-prioritized output matrix for a case where an amount of heat dissipated from a sodium-sulfur battery is a minimum heat dissipation amount. A schematic view of FIG. 17 is a flow chart showing a flow of processes performed by a calculation mechanism in a case where the calculation mechanism calculates a power-prioritized output matrix for a case where an amount of heat dissipated from a sodium-sulfur battery is a maximum heat dissipation amount and a power-prioritized output matrix for a case where an amount of heat dissipated from a sodium-sulfur battery is a minimum heat dissipation amount.

According to the present embodiment, as shown in FIG. 16, the memory mechanism 1040 stores a power-prioritized resource matrix 1350 for a case where an amount of heat dissipated from the sodium-sulfur battery 1020 is a maximum heat dissipation amount, and a power-prioritized resource matrix 1351 for a case where an amount of heat dissipated from the sodium-sulfur battery 1020 is a minimum heat dissipation amount.

Each of the power-prioritized resource matrix 1350 for a case where an amount of heat dissipated from the sodium-sulfur battery 1020 is a maximum heat dissipation amount, and the power-prioritized resource matrix 1351 for a case where an amount of heat dissipated from the sodium-sulfur battery 1020 is a minimum heat dissipation amount, is a candidate for a resource matrix to be referred.

Figure 17:
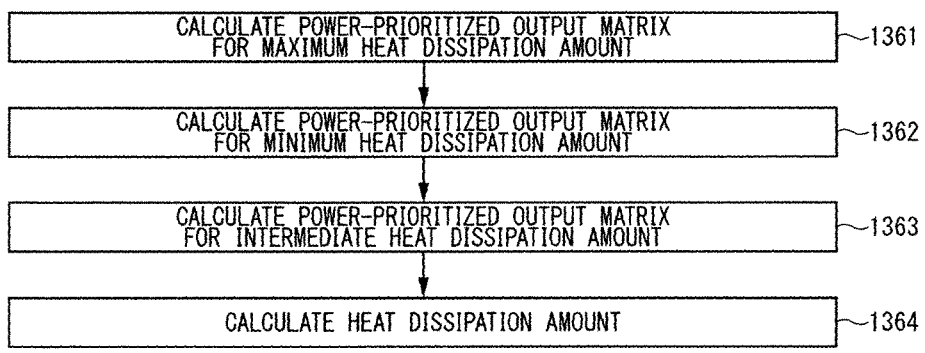
FIG. 17 is a flow chart showing a flow of processes performed by a calculation mechanism.

According to the present embodiment, the calculation mechanism 1041, in a step 1361 in FIG. 17, calculates a power-prioritized output matrix in such a manner as shown in the steps 1121 to 1128 in FIG. 4 by using the power-prioritized resource matrix 1350 for a case where an amount of heat dissipated from the sodium-sulfur battery 1020 is a maximum heat dissipation amount, as a resource matrix to be referred, to thereby calculate a power-prioritized output matrix for a case where an amount of heat dissipated from the sodium-sulfur battery 1020 is a maximum heat dissipation amount.

Subsequently, the calculation mechanism 1041, in a step 1362 in FIG. 17, calculates a power-prioritized output matrix in such a manner as shown in the steps 1121 to 1128 in FIG. 4 by using the power-prioritized resource matrix 1351 for a case where an amount of heat dissipated from the sodium-sulfur battery 1020 is a minimum heat dissipation amount, as a resource matrix to be referred, to thereby calculate a power-prioritized output matrix for a case where an amount of heat dissipated from the sodium-sulfur battery 1020 is a minimum heat dissipation amount.

Subsequently, the calculation mechanism 1041, in a step 1363 in FIG. 17, calculates a power-prioritized output matrix for a case where an amount of heat dissipated from the sodium-sulfur battery 1020 is a heat dissipation amount which is intermediate between a maximum heat dissipation amount and a minimum heat dissipation amount. A power-prioritized output matrix for a case where an amount of heat dissipated from the sodium-sulfur battery 1020 is a heat dissipation amount which is intermediate between a maximum heat dissipation amount and a minimum heat dissipation amount, is calculated, for example, by carrying out arithmetic averaging or weighted averaging on a power-prioritized output matrix for a case where an amount of heat dissipated from the sodium-sulfur battery 1020 is a maximum heat dissipation amount and a power-prioritized output matrix for a case where an amount of heat dissipated from the sodium-sulfur battery 1020 is a minimum heat dissipation amount. In the step 1363, two or more power-prioritized output matrices which are different from each other in weighting coefficient, may be calculated.

Subsequently, the calculation mechanism 1041, in a step 1364 in FIG. 17, calculates an amount of heat dissipated from the sodium-sulfur battery 1020 in a case where an amount of heat dissipated from the sodium-sulfur battery 1020 is a heat dissipation amount which is intermediate between a maximum heat dissipation amount and a minimum heat dissipation amount. The steps 1363 and 1364 may be omitted.

In a case where an amount of heat dissipated from the sodium-sulfur battery 1020 is a maximum heat dissipation amount, while power which can be discharged by the sodium-sulfur battery 1020 is increased and a period of time during which the sodium-sulfur battery 1020 can continue discharging is lengthened, there is a strong possibility that power consumed by a heater for heating the sodium-sulfur battery 1020 in order to maintain a temperature of the sodium-sulfur battery 1020 would be increased. On the other hand, in a case where an amount of heat dissipated from the sodium-sulfur battery 1020 is a minimum heat dissipation amount, while power which can be discharged by the sodium-sulfur battery 1020 is reduced and a period of time during which the sodium-sulfur battery 1020 can continue discharging is shortened, there is a strong possibility that power consumed by a heater for heating the sodium-sulfur battery 1020 in order to maintain a temperature of the sodium-sulfur battery 1020 would be reduced. Output of a plurality of power-prioritized output matrices which are differentiated from each other in an amount of heat dissipated from the sodium-sulfur battery 1020, such as a power-prioritized output matrix for a case where an amount of heat dissipated from the sodium-sulfur battery 1020 is a relatively large heat dissipation amount W1 and a power-prioritized output matrix for a case where an amount of heat dissipated from the sodium-sulfur battery 1020 is a relatively small heat dissipation amount W2 (W2<W1), would help an operator in selecting an appropriate charge/discharge condition, and calculation in conjunction with a heat dissipation amount would facilitate more quantitative determination.

12 Calculation of a Plurality of Charge/Discharge Time Periods

Below, there will be described an embodiment in which the calculation mechanism 1041 calculates a power-prioritized output matrix with respect to each of a plurality of charge/discharge time periods.

Figure 18:
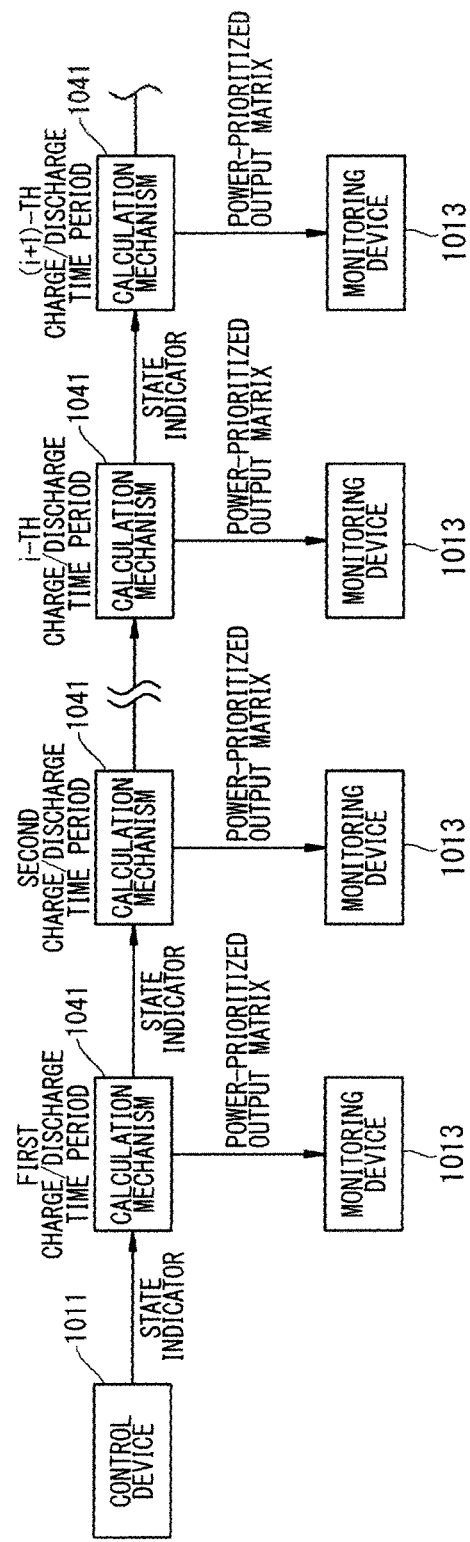
FIG. 18 is a schematic view showing processes for calculating a power-prioritized output matrix.

A schematic view of FIG. 18 shows processes performed in calculation of a power-prioritized output matrix with respect to each of a plurality of charge/discharge time periods.

As shown in FIG. 18, the calculation mechanism 1041 receives an input of a state indicator from the control device 1011 with respect to the first charge/discharge time period, calculates a power-prioritized output matrix, inputs the calculated power-prioritized output matrix to the monitoring device 1013, and calculates a post-charge/discharge state indicator. Also, when i is a natural number, the calculation mechanism 1041 receives, as a new state indicator, an input of a post-charge/discharge state indicator which is calculated with respect to the i-th charge/discharge time period, and calculates a charge/discharge condition and a post-charge/discharge state indicator with respect to the (i+1)-th charge/discharge time period following the i-th charge/discharge time period. As a result of this, in a case where a state indicator is input to the calculation mechanism 1041 from an outside of the data logger 1012 with respect to the first charge/discharge time period, a power-prioritized output matrix with respect to each of all of charge/discharge time periods after the first charge/discharge time period is calculated in a chain-like manner. In a plurality of charge/discharge time periods, a charge time period may occur after a discharge time period, a discharge time period may occur after a charge time period, a discharge time period in which discharge is conducted under one discharge condition may occur after a discharge time period in which discharge is conducted under another discharge condition, or a charge time period in which charge is conducted under one charge condition may occur after a charge time period in which charge is conducted under another charge condition.

In place of a power-prioritized output matrix, or in addition to a power-prioritized output matrix, similar calculations may be performed with respect to a time-prioritized output matrix.

While the invention has been shown and described in detail, the foregoing description is in all aspects illustrative and not restrictive. It is therefore understood that numerous modifications and variations can be devised without departing from the scope of the invention.

REFERENCE SIGNS LIST

1012: data logger
1020: sodium-sulfur battery
1040: memory mechanism
1041: calculation mechanism
1050: power-prioritized resource matrix
1051: time-prioritized resource matrix

The invention claimed is:

1. A device for calculating a charge/discharge condition which is adoptable in a secondary battery of high-temperature operation type, comprising:
    a memory mechanism which stores a lookup table to be referred, said lookup table to be referred including a plurality of state indicators and including a charge/discharge condition corresponding to each of said plurality of state indicators, to thereby include a plurality of charge/discharge conditions, wherein: said plurality of charge/discharge conditions are determined so that the charge/discharge condition corresponding to each of said plurality of state indicators is adoptable in the secondary battery in a case where a state of the secondary battery is indicated by each of said plurality of state indicators; each of said plurality of state indicators includes a value or a set of values; and each of said plurality of charge/discharge conditions includes a value or a set of values; and
    a calculation mechanism configured to make a state indicator which indicates the state of the secondary battery be input to, select two or more state indicators which are related to an input state indicator so as to satisfy a condition, from said plurality of state indicators, extract a charge/discharge condition corresponding to each of two or more selected state indicators from said plurality of charge/discharge conditions, to thereby extract two or more charge/discharge conditions, perform interpolation in the two or more selected state indicators and two or more extracted charge/discharge conditions to calculate a charge/discharge condition which is adoptable in the secondary battery in a case where the state of the secondary battery is indicated by the input state indicator, the input state indicator including a value or a set of values.

2. The device for calculating a charge/discharge condition which is adoptable in a secondary battery of high-temperature operation type according to claim 1, wherein
    said memory mechanism stores a power-prioritized lookup table and a time-prioritized lookup table,
    each of said power-prioritized lookup table and said time-prioritized lookup table is a candidate for said lookup table to be referred,
    in a case where said power-prioritized lookup table is said lookup table to be referred, each of said plurality of charge/discharge conditions includes a first plurality of charge/discharge power values and includes a first charge/discharge time value corresponding to each of said first plurality of charge/discharge power values, to thereby include a first plurality of charge/discharge time values, said first plurality of charge/discharge time values being determined so that the longest time during which the secondary battery is able to continue being charged or discharging is indicated by the first charge/discharge time value corresponding to each of said first plurality of charge/discharge power values in a case where charge/discharge power of the secondary battery is indicated by each of said first plurality of charge/discharge power values, and said first plurality of charge/discharge power values being indexes,
    in a case where said time-prioritized lookup table is said lookup table to be referred, each of said plurality of charge/discharge conditions includes a second plurality of charge/discharge time values and includes a second charge/discharge power value corresponding to each of said second plurality of charge/discharge time values, to thereby include a second plurality of charge/discharge power values, said second plurality of charge/discharge power values being determined so that maximum power which is charged into, or is discharged by, the secondary battery is indicated by the second charge/discharge power value corresponding to each of said second plurality of charge/discharge time values in a case where charge/discharge time of the secondary battery is indicated by each of said second plurality of charge/discharge time values, and said second plurality of charge/discharge time values being indexes, and
    said calculation mechanism is configured to calculate a charge/discharge condition by using said power-prioritized lookup table as said lookup table to be referred, to thereby calculate a power-prioritized charge/discharge condition which is adoptable in the secondary battery, and calculate a charge/discharge condition by using said time-prioritized lookup table as said lookup table to be referred, to thereby calculate a time-prioritized charge/discharge condition which is adoptable in the secondary battery.

3. The device for calculating a charge/discharge condition which is adoptable in a secondary battery of high-temperature operation type according to claim 1, wherein
    said memory mechanism stores a plurality of deterioration state values, and stores a lookup table corresponding to each of said plurality of deterioration state values, to thereby store a plurality of lookup tables,
    said plurality of lookup tables are determined so that a charge/discharge condition is calculated by using the lookup table corresponding to each of said plurality of deterioration state values as said lookup table to be referred in a case where a deterioration state of the secondary battery is indicated by each of said plurality of deterioration state values,
    each of said plurality of lookup tables is a candidate for said lookup table to be referred, and
    said calculation mechanism is configured to make a deterioration state value indicating the deterioration state of the secondary battery be input to, select a deterioration state value which is related to an input deterioration state value so as to satisfy a condition, from said plurality of deterioration state values, extract a lookup table corresponding to a selected deterioration state value from said plurality of lookup tables, and calculate a charge/discharge condition by using a extracted lookup table as said lookup table to be referred, to thereby calculate a charge/discharge condition which is adoptable in the secondary battery in a case where the deterioration state of the secondary battery is indicated by the input deterioration state value.

4. The device for calculating a charge/discharge condition which is adoptable in a secondary battery of high-temperature operation type according to claim 1, wherein
    said memory mechanism stores a plurality of deterioration state values, and stores a lookup table corresponding to each of said plurality of deterioration state values, to thereby store a plurality of lookup tables,
    said plurality of lookup tables are determined so that a charge/discharge condition is calculated by using the lookup table corresponding to each of said plurality of deterioration state values as said lookup table to be referred in a case where a deterioration state of the secondary battery is indicated by each of said plurality of deterioration state values,
    each of said plurality of lookup tables is a candidate for said lookup table to be referred, and said calculation mechanism is configured to make a deterioration state value indicating the deterioration state of the secondary battery be input to, select two deterioration state values which are related to an input deterioration state value so as to satisfy a condition, from said plurality of deterioration state values, extract a lookup table corresponding to each of two selected deterioration state values from said plurality of lookup tables, to thereby extract two lookup tables, calculate a charge/discharge condition by using each of two extracted lookup tables as said lookup table to be referred, to thereby calculate two charge/discharge conditions, perform interpolation in the two selected deterioration state values and two calculated charge/discharge conditions, to thereby calculate a charge/discharge condition which is adoptable in the secondary battery in a case where the deterioration state of the secondary battery is indicated by the input deterioration state value.

5. The device for calculating a charge/discharge condition which is adoptable in a secondary battery of high-temperature operation type according to claim 3, wherein
each of said plurality of deterioration state values is the number of equivalent cycles or an indicator value of internal resistance, and
the input deterioration state value is the number of equivalent cycles or an indicator value of internal resistance.

6. The device for calculating a charge/discharge condition which is adoptable in a secondary battery of high-temperature operation type according to claim 4, wherein
each of said plurality of deterioration state values is the number of equivalent cycles or an indicator value of internal resistance, and
the input deterioration state value is the number of equivalent cycles or an indicator value of internal resistance.

7. The device for calculating a charge/discharge condition which is adoptable in a secondary battery of high-temperature operation type according to claim 1, wherein
said memory mechanism stores a lookup table for a case where a rise in a temperature of a the secondary battery to a relatively high temperature is permissible, and a lookup table for a case where a rise in a temperature of the secondary battery to a relatively low temperature is permissible,
each of said lookup table for a case where a rise in a temperature of the secondary battery to a relatively high temperature is permissible, and said lookup table for a case where a rise in a temperature of the secondary battery to a relatively low temperature is permissible, is a candidate for said lookup table to be referred, and
said calculation mechanism is configured to calculate a charge/discharge condition by using said lookup table for a case where a rise in a temperature of the secondary battery to a relatively high temperature is permissible, as said lookup table to be referred, to thereby calculate a charge/discharge condition for a case where a rise in a temperature of the secondary battery to a relatively high temperature is permissible, and calculate a charge/discharge condition by using said lookup table for a case where a rise in a temperature of the secondary battery to a relatively low temperature is permissible, as said lookup table to be referred, to thereby calculate a charge/discharge condition for a case where a rise in a temperature of the secondary battery to a relatively low temperature is permissible.

8. The device for calculating a charge/discharge condition which is adoptable in a secondary battery of high-temperature operation type according to claim 7, wherein
said calculation mechanism is configured to calculate a charge/discharge condition for a case where a rise in a temperature of the secondary battery to a temperature which is intermediate between said relatively high temperature and said relatively low temperature is permissible.

9. The device for calculating a charge/discharge condition which is adoptable in a secondary battery of high-temperature operation type according to claim 1, wherein
an amount of heat dissipated from the secondary battery is variable,
said memory mechanism stores a lookup table for a case where an amount of heat dissipated from the secondary battery is a relatively large heat dissipation amount, and a lookup table for a case where an amount of heat dissipated from the secondary battery is a relatively small heat dissipation amount,
each of said lookup table for a case where an amount of heat dissipated from the secondary battery is a relatively large heat dissipation amount, and said lookup table for a case where an amount of heat dissipated from the secondary battery is a relatively small heat dissipation amount, is a candidate for said lookup table to be referred,
said calculation mechanism is configured to calculate a charge/discharge condition by using said lookup table for a case where an amount of heat dissipated from the secondary battery is a relatively large heat dissipation amount, as said lookup table to be referred, to thereby calculate a charge/discharge condition for a case where an amount of heat dissipated from the secondary battery is a relatively large heat dissipation amount, and calculate a charge/discharge condition by using said lookup table for a case where an amount of heat dissipated from the secondary battery is a relatively small heat dissipation amount, as said lookup table to be referred, to thereby calculate a charge/discharge condition for a case where an amount of heat dissipated from the secondary battery is a relatively small heat dissipation amount.

10. The device for calculating a charge/discharge condition which is adoptable in a secondary battery of high-temperature operation type according to claim 9, wherein
said calculation mechanism is configured to calculate a charge/discharge condition for a case where an amount of heat dissipated from the secondary battery is a heat dissipation amount which is intermediate between said relatively large heat dissipation amount and said relatively small heat dissipation amount.

11. The device for calculating a charge/discharge condition which is adoptable in a secondary battery of high-temperature operation type according to claim 10, wherein
said calculation mechanism is configured to calculate an amount of heat dissipated from the secondary battery in a case where an amount of heat dissipated from the secondary battery is a heat dissipation amount which is intermediate between said relatively large heat dissipation amount and said relatively small heat dissipation amount.

12. The device for calculating a charge/discharge condition which is adoptable in a secondary battery of high-temperature operation type according to claim 1, wherein
said lookup table to be referred includes a post-charge/discharge state indicator corresponding to each of said plurality of state indicators, to thereby include a plurality of post-charge/discharge state indicators, said plurality of post-charge/discharge state indicators are determined so that a post-charge/discharge state of the secondary battery is indicated by the post-charge/discharge state indicator corresponding to each of said plurality of state indicators in a case where the state of the secondary battery is indicated by each of said plurality of state indicators and the secondary battery discharges or is charged under the charge/discharge condition corresponding to each of said plurality of state indicators, each of said plurality of post-charge/discharge state indicators includes a value or a set of values, and said calculation mechanism is configured to
  extract a post-charge/discharge state indicator corresponding to each of the two or more selected state indicators from said plurality of post-charge/discharge state indicators, to thereby extract two or more post-charge/discharge state indicators, perform interpolation in the two or more selected state indicators and two or more extracted post-charge/discharge state indicators, and calculate a post-charge/discharge state indicator which indicates the post-charge/discharge state of the secondary battery in a case where the state of the secondary battery is indicated by the input state indicator and the secondary battery discharges or is charged under the calculated charge/discharge condition, with respect to a first charge/discharge time period, make an state indicator from an outside of the device for calculating a charge/discharge condition which is adoptable in a secondary battery of high-temperature operation type be input to, calculate a charge/discharge condition and a post-charge/discharge state indicator, and when i is a natural number, with respect to an (i+1)-th charge/discharge time period following an i-th charge/discharge time period, make an post-charge/discharge state indicator which is calculated with respect to the i-th charge/discharge time period be input to, and calculate a charge/discharge condition and a post-charge/discharge state indicator.

13. The device for calculating a charge/discharge condition which is adoptable in a secondary battery of high-temperature operation type, according to claim 1, wherein
  each of said plurality of state indicators includes a set of a temperature value and a state-of-charge value, and
  the input state indicator includes a set of a temperature value and a state-of-charge value.

* * * * *